(12) United States Patent
Bull et al.

(10) Patent No.: US 9,674,412 B2
(45) Date of Patent: Jun. 6, 2017

(54) MULTI-SENSOR CAMERA WITH APERTURED CIRCUIT-CARRYING SUBSTRATE

(71) Applicant: POINT GREY RESEARCH INC., Richmond (CA)

(72) Inventors: Jeffrey David Bull, New Westminster (CA); Donald Ray Murray, Vancouver (CA)

(73) Assignee: FLIR Commercial Systems, Inc., Wilsonville, OR (US)

( * ) Notice: Subject to any disclaimer, the term of this patent is extended or adjusted under 35 U.S.C. 154(b) by 0 days.

(21) Appl. No.: 14/449,903

(22) Filed: Aug. 1, 2014

(65) Prior Publication Data

US 2016/0037031 A1    Feb. 4, 2016

(51) Int. Cl.
| | |
|---|---|
| H04N 5/225 | (2006.01) |
| H05K 1/02 | (2006.01) |
| H05K 7/20 | (2006.01) |
| H05K 1/14 | (2006.01) |
| H04N 13/02 | (2006.01) |

(52) U.S. Cl.
CPC ......... *H04N 5/2253* (2013.01); *H04N 5/2254* (2013.01); *H04N 13/0239* (2013.01); *H05K 1/0201* (2013.01); *H05K 1/0278* (2013.01); *H05K 1/14* (2013.01); *H05K 7/2039* (2013.01); *H05K 2201/042* (2013.01); *H05K 2201/068* (2013.01); *H05K 2201/09063* (2013.01); *H05K 2201/10121* (2013.01)

(58) Field of Classification Search
None
See application file for complete search history.

(56) References Cited

U.S. PATENT DOCUMENTS

| | | | |
|---|---|---|---|
| 5,166,865 A | 11/1992 | Morrison et al. | |
| 5,802,914 A | 9/1998 | Fassler et al. | |
| 6,142,791 A | 11/2000 | Yagi et al. | |
| 2005/0047776 A1* | 3/2005 | Watanabe | G02B 7/28 396/543 |
| 2005/0237467 A1* | 10/2005 | Takaishi | G02F 1/13452 349/149 |
| 2008/0225129 A1* | 9/2008 | Viinikanoja | H04N 13/0239 348/218.1 |

FOREIGN PATENT DOCUMENTS

| | | |
|---|---|---|
| EP | 1496728 A1 | 1/2005 |
| EP | 2000951 A1 | 12/2008 |
| EP | 2555333 A1 | 2/2013 |
| JP | 2004-341292 A | 12/2004 |
| NL | 9000279 A | 9/1991 |
| WO | 2012127355 A1 | 9/2012 |

OTHER PUBLICATIONS

Wannemacher, Jr., United States Statutory Invention Registration No. H921, May 7, 1991.

* cited by examiner

*Primary Examiner* — Mark T Monk
(74) *Attorney, Agent, or Firm* — Haynes and Boone, LLP

(57) ABSTRACT

A circuit-carrying assembly for use in an imaging system, the assembly comprising a first circuit carrier; a second circuit carrier spaced apart from the first circuit carrier; at least one attachment member to attach the circuit-carrying assembly to a rigid support member; and a compliant part between the first circuit carrier and the second circuit carrier, the compliant part allowing the second circuit carrier to move towards and away from the first circuit carrier.

36 Claims, 18 Drawing Sheets

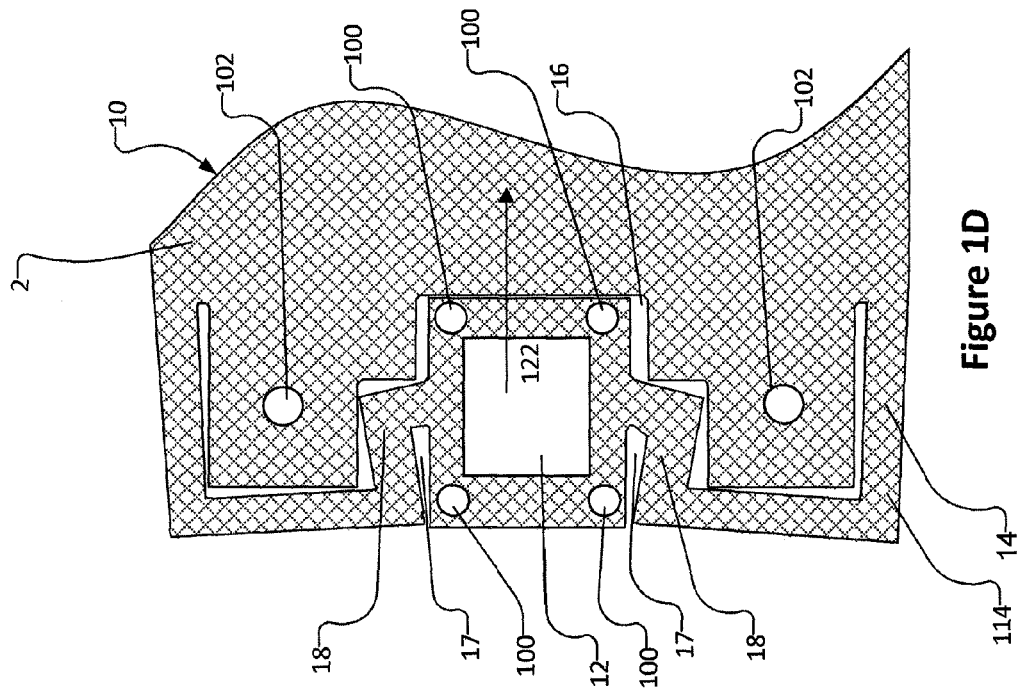
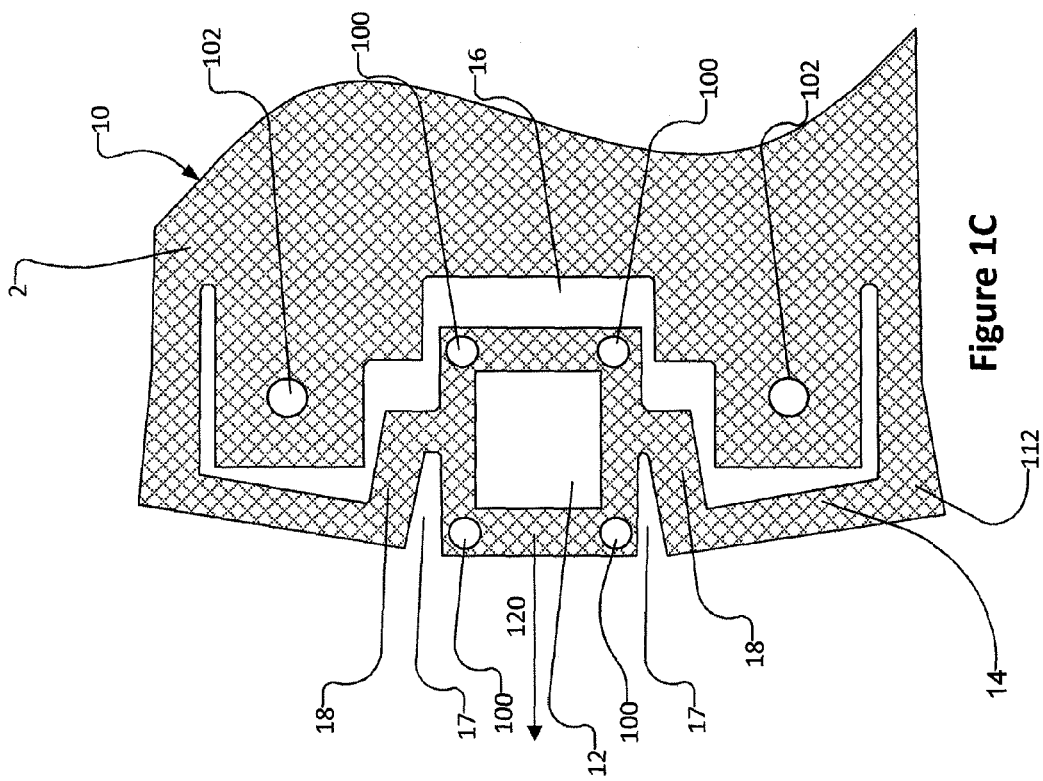

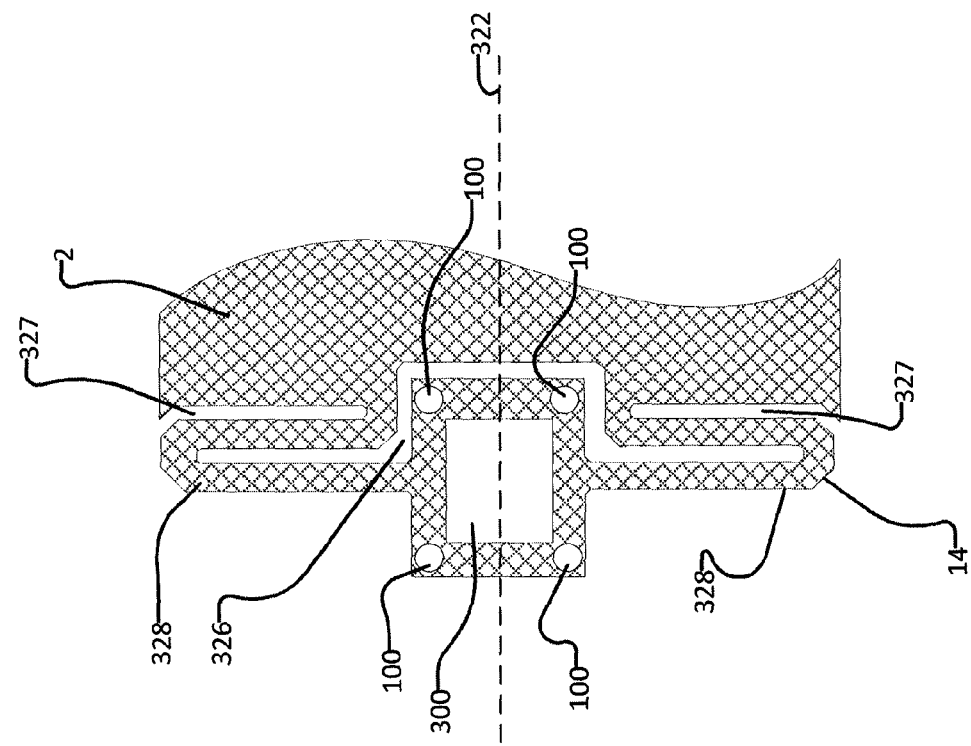
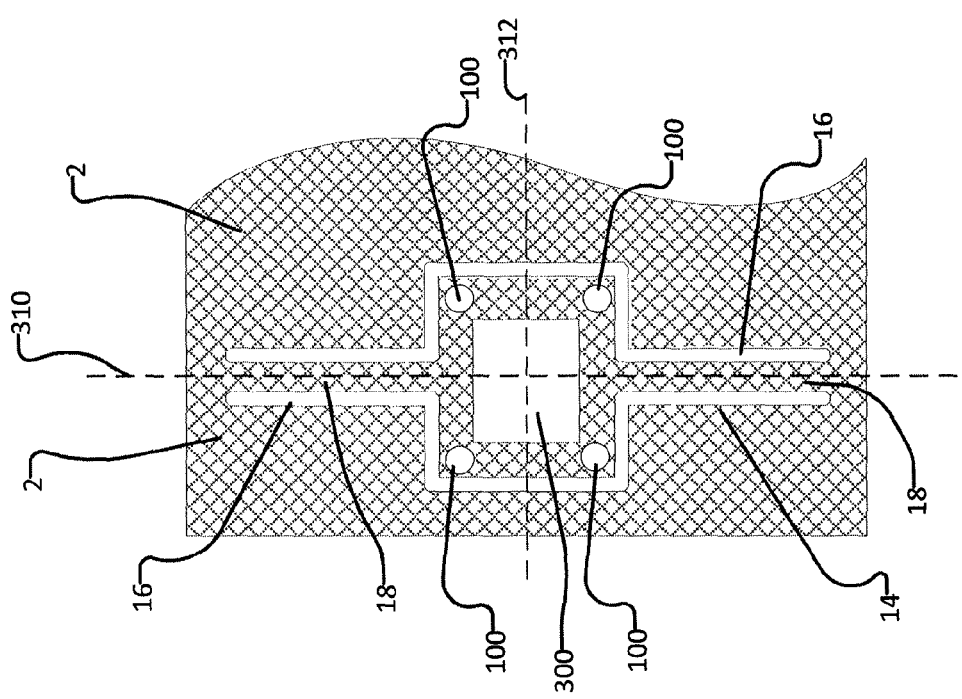
Figure 3A
Figure 3B

MULTI-SENSOR CAMERA WITH APERTURED CIRCUIT-CARRYING SUBSTRATE

FIELD OF THE INVENTION

This invention relates to multi-sensor cameras, particularly, stereoscopic cameras. The invention provides for circuit-carrying assemblies and imaging systems incorporating the same.

BACKGROUND

Digital cameras can be used to identify objects and to determine the orientations and locations of the objects. Imaging objects from different camera locations may be used to determine distances to the objects and the configuration of the objects in 3D. An example of a stereoscopic camera that is sometimes used for such applications is the BUMBLEBEE™ camera system available from Point Grey Research of Richmond, British Columbia, Canada.

Performing stereo image processing to determine the location of points on an object in 3D requires knowledge of the locations and orientations of the cameras used to acquire the images. It is desirable in an imaging system to be used for stereoscopic imaging that the relative locations and orientations of the imaging chips be fixed or at least known at all times so that the stereo camera system can be calibrated once and thereafter used to accurately determine the location of points on objects within its field of view.

Changes in temperature can cause thermal expansion and contraction of different parts of a 3D imaging system. The expansion and contraction may result in forces moving the imaging chip orientations out of their original pointing directions or positions, resulting in lost calibration.

There is a need for reliable and cost effective stereoscopic camera systems which avoid inaccuracies due to thermal expansion and contraction.

SUMMARY

In order to address the foregoing, the invention provides a circuit-carrying assembly having one or more compliant parts. The compliant part allows the circuit-carrying assembly to expand or contract together with other parts of an imaging system to avoid unpredictable changes in location or orientation of image sensors as a result of differential thermal expansion or contraction between the circuit-carrying assembly and other components. Thus, the compliant part permits a single circuit-carrying assembly to act mechanically as two or more separate circuit-carrying substrates without sacrificing the benefits of a single circuit-carrying substrate (ease of assembly, efficiency of fabrication, etc.).

One aspect of the invention provides a circuit-carrying assembly for use in an imaging system, the assembly comprises a first circuit carrier, a second circuit carrier spaced apart from the first circuit carrier, at least one attachment member to attach the circuit-carrying assembly to a rigid support member, and a compliant part between the first circuit carrier and the second circuit carrier. The compliant part is configured to allow the second circuit carrier to move toward and away from the first circuit carrier. The compliant part and first and second circuit carriers may all be formed in a circuit board. Imaging chips and/or structured light sources may be mounted on the first and second parts. In some embodiments the circuit-carrying assembly is generally planar and the compliant part permits relative motion of the first and second circuit carriers in a plane of the circuit-carrying assembly.

In an example embodiment the compliant part comprises one or more compliant bridges formed in the circuit board and having portions extending in a direction that is transverse to an axis extending between the first and second parts. The compliant part may be formed, for example, by making cuts and/or apertures in a sheet of circuit board material to yield bridges in the circuit board material that can resiliently bend in a plane of the sheet of circuit board material.

In some example embodiments the compliant part comprises a part wherein the circuit board is cut away to provide thin strips of the circuit board, the thin strips connecting the first and second parts. One or more of the thin strips may have a ratio of length-to-width in the range of 4 to 20. The thin strips may be arranged so that the thin strips have sections extending generally transversely to an axis extending between the first and second parts. The thin strips may be arranged so that the thin strips have sections extending at 90 degrees plus or minus fifteen or twenty degrees to an axis extending between the first and second parts. In some embodiments the thin strips extend across the compliant part in a sinuous fashion.

In some embodiments one or more compliant parts are symmetrical about the axis extending between the first and second parts.

In any of the embodiments electrically-conductive traces may extend along the thin strips. In embodiments where the thin strips are formed in a multi-layer circuit board, electrically-conductive traces may extend along the thin strips in two or more of the layers. In some embodiments two or more electrically-conductive traces extend side-by side along one of more of the thin strips.

In some embodiments the rigid support member has first and second apertures respectively located adjacent to the first and second parts and the imaging system comprises a lens supported in the first aperture.

In some embodiments the circuit board assembly is L-shaped, or T-shaped or has a plurality of arms. Some embodiments provide a at least one thermally conductive path thermally connecting the circuit board assembly to the rigid support member. For example, a thermally conducting path may be provided at or near a midpoint between the first part and the second part.

Another aspect provides a circuit-carrying assembly for use in an imaging system. The assembly comprises a first circuit carrier; a second circuit carrier spaced apart from the first circuit carrier; at least one attachment member to attach the circuit-carrying assembly to a rigid support member; and a compliant part between the first circuit carrier and the second circuit carrier. The compliant part allows the second circuit carrier to move toward and away from the first circuit carrier. The first circuit carrier and the second circuit carrier are both parts of a unitary circuit-carrying substrate such as, for example, a circuit board.

In some embodiments the circuit-carrying substrate is planar and the compliant part comprises a strip of the circuit-carrying substrate that is resiliently flexible in a plane of the circuit-carrying substrate. The first circuit carrier and the second circuit carrier may, for example, be located at opposed edges of the unitary circuit-carrying substrate. In some embodiments the at least one bridge member has a ratio of length-to-width in the range of 4 to 20. In some embodiments the at least one bridge member extends across the compliant part in a sinuous fashion. In some embodiments the at least one bridge member extends transversely to an axis extending between the first circuit carrier and the second circuit carrier. In some embodiments the compliant part is symmetrical about an axis extending between the first circuit carrier and the second circuit carrier. In some embodiments, each of the first circuit carrier and the second circuit carrier comprises a circuit-carrying island. A circuit-carrying assembly may have two, three or more circuit carrying assemblies. Compliant parts may be located between any of the circuit-carrying assemblies.

Another aspect provides a circuit board for an imaging system. The circuit board comprises a circuit board substrate comprising a first circuit carrier, a second circuit carrier and at least one compliant portion located between the first and second circuit carrier. A first image sensor is mounted on the first circuit carrier. An electro optical component comprising a second image sensor or a structured light source is mounted on the second circuit carrier. A data communication interface on the circuit board substrate is electrically connected to receive data from the first image sensor by way of conducting traces extending through the at least one compliant portion. In some embodiments the data communication interface is electrically connected to receive data from a second image sensor mounted on the first circuit carrier by way of the conducting traces.

Another aspect of the invention provides a rigid support member, a circuit board assembly comprising a first part carrying a first image sensor, a second part spaced apart from the first part and carrying an optical device, and a compliant part between the first and the second parts. The compliant part is configured to allow the second part to move toward and away from the first part. The assembly comprises a first attachment attaching the first part to the rigid support member and a second attachment attaching the second part to the rigid support member.

Another aspect provides a camera comprising first and second imaging chips mounted to a circuit board. The circuit board is mounted to a rigid support member at first and second spaced-apart attachment points. A compliant part is formed in the circuit board between the first and second attachment points. The compliant part is flexible in the plane of the circuit board and accommodates relative motion between the first and second attachment points arising from thermal expansion/contraction or from other sources.

In addition to the exemplary aspects and embodiments described above, further aspects and embodiments will become apparent by reference to the drawings and by study of the following detailed description.

BRIEF DESCRIPTION OF THE DRAWINGS

The accompanying drawings illustrate non-limiting example embodiments of the invention. It is intended that the embodiments and figures disclosed herein are to be considered illustrative rather than restrictive.

FIG. 1C is a plan view illustrating a compliant part for the first circuit carrier of the circuit-carrying assembly of FIG. 1B in an expanded state.

FIG. 1D is a plan view illustrating a compliant part for the first circuit carrier of the circuit-carrying assembly of FIG. 1B in a contracted state.

FIG. 3A is a plan view illustrating a compliant part of a circuit-carrying assembly according to an example embodiment of the invention.

FIG. 3B is a plan view illustrating a compliant part of a circuit-carrying assembly according to an example embodiment of the invention.

DESCRIPTION

Throughout the following description specific details are set forth in order to provide a more thorough understanding to persons skilled in the art. However, well known elements may not have been shown or described in detail to avoid unnecessarily obscuring the disclosure. The following description of examples of the technology is not intended to be exhaustive or to limit the system to the precise forms of any example embodiment. Accordingly, the description and drawings are to be regarded in an illustrative, rather than a restrictive, sense.

Figure 1A:
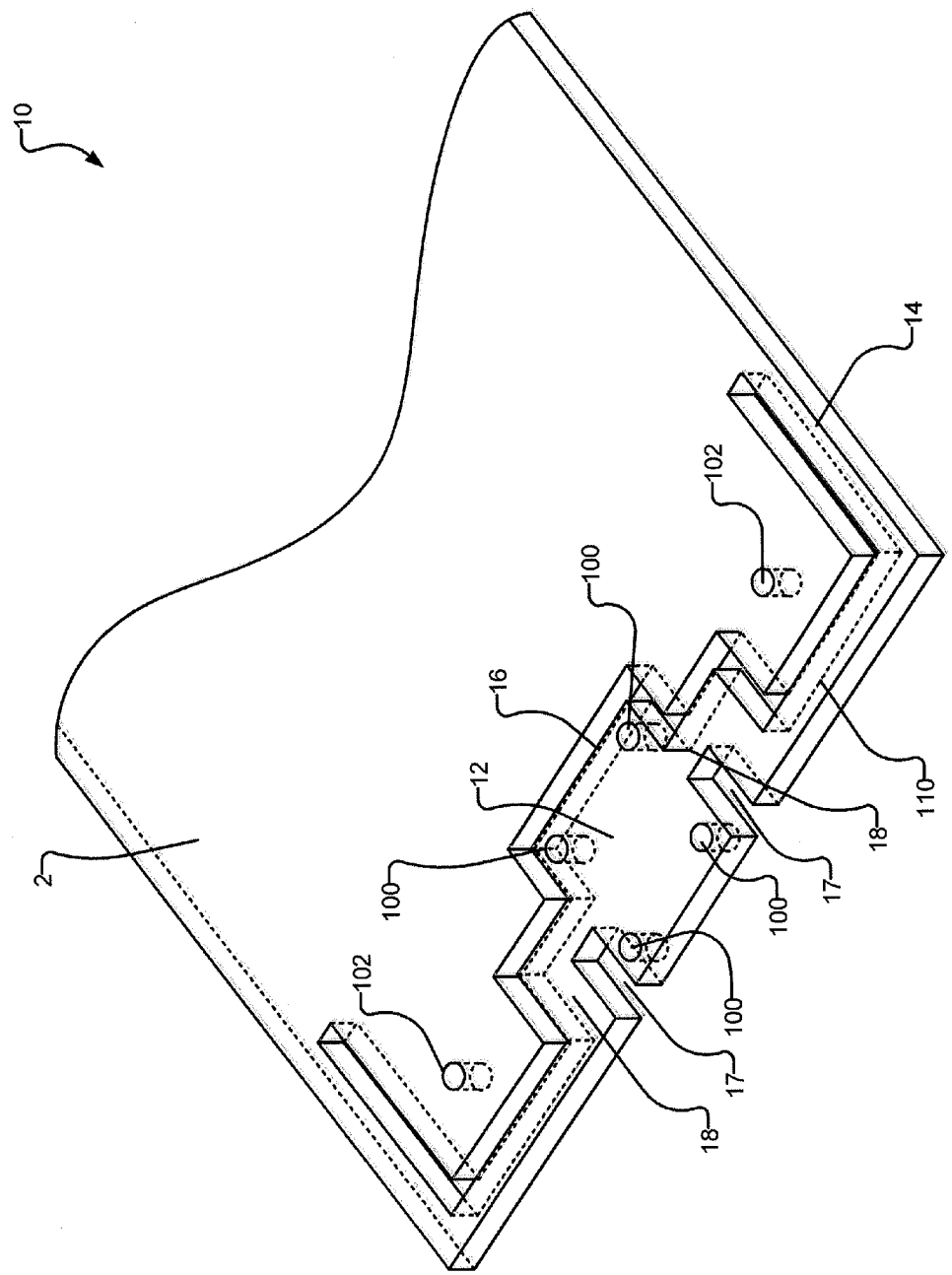
FIG. 1A is a perspective view illustrating one side of a circuit-carrying assembly for use in an imaging system according to one non-limiting example embodiment of the invention.

FIG. 1A is a perspective view illustrating one side of a circuit-carrying assembly 10 for use in an imaging system according to one embodiment of the invention. Circuit-carrying assembly 10 comprises a first circuit carrier 12 and a compliant part 14. In this embodiment, circuit-carrying assembly 10 is formed of a single circuit-carrying substrate 2. Substrate 2 may, for example, comprise a circuit board. In some embodiments, the circuit board is a multi-layer circuit board. For example, the circuit board may have 3 to 10 layers in some embodiments. In an example embodiment, the circuit board is a 6 layer circuit board.

Circuit-carrying assembly 10 is mountable to a rigid support member. The rigid support member provides mechanical support to circuit-carrying assembly 10. In the illustrated embodiment, circuit carrying assembly 10 comprises rigid support member apertures 100 for mounting circuit-carrying assembly 10 to a rigid support member. Other means may be used to attach circuit-carrying assembly 10 (or other circuit-carrying assemblies as described herein) to a rigid support member in addition to or instead of fasteners engaged through apertures 100. For example, suitable clips, clamps, adhesives could be applied to affix circuit-carrying assembly 10 to a rigid support member. Circuit-carrying assembly 10 also comprises case mount apertures 102 for mounting one or more cases over circuit-carrying assembly 10.

One issue that can occur when two members having different coefficients of thermal expansion are attached to one another at spaced-apart locations is that changes in temperature result in dimensional changes that can cause very large forces being exerted at the mounting locations. These forces may result in bending or buckling of one or both members and/or loosening or breaking of fasteners or other means that attach the members together at the spaced apart points. In a camera such distortions could cause components such as image sensors or structured light sources to become misaligned with one another and/or with other components such as lenses with the result that calibration of the camera may be lost. Such distortions could occur, for example in cases where a circuit board for a stereo camera is attached at spaced apart points to a rigid support member such as a metal beam, bar or plate of the camera. Circuit board material is substantially non-elastic in the plane of the circuit board. Embodiments as described herein provide compliant parts that permit compression and extension in the plane of a circuit-carrying assembly. Providing such compliant parts may reduce forces on attachment points and may avoid buckling, bending or other distortions of circuit-carrying members and their support members.

Returning to the embodiment of FIG. 1A, compliant part 14 may be formed by aperture 16 or edge cut-outs 17 or a combination of both. Compliant part 14 may comprise at least one compliant substrate bridge 18 connecting first circuit carrier 12 to the remainder of single circuit-carrying substrate 2. In this example embodiment, first circuit carrier 12 comprises a circuit-carrying island formed by a single aperture 16 and two edge cut-outs 17 extending from the side edge of single circuit-carrying substrate 2. First circuit carrier 12 is connected to the rest of single circuit-carrying substrate 2 through two compliant substrate bridges 18. Compliant part 14 permits relatively free movement of first circuit carrier 12 relative to the rest of circuit-carrying substrate 2. Compliant part 14 may allow movement resulting from thermal expansion or contraction of substrate 2 and/or a rigid support member to which circuit-carrying substrate 2 is attached in the plane of substrate 2. In one embodiment, the rigid support member comprises a support bar.

Figure 1B:
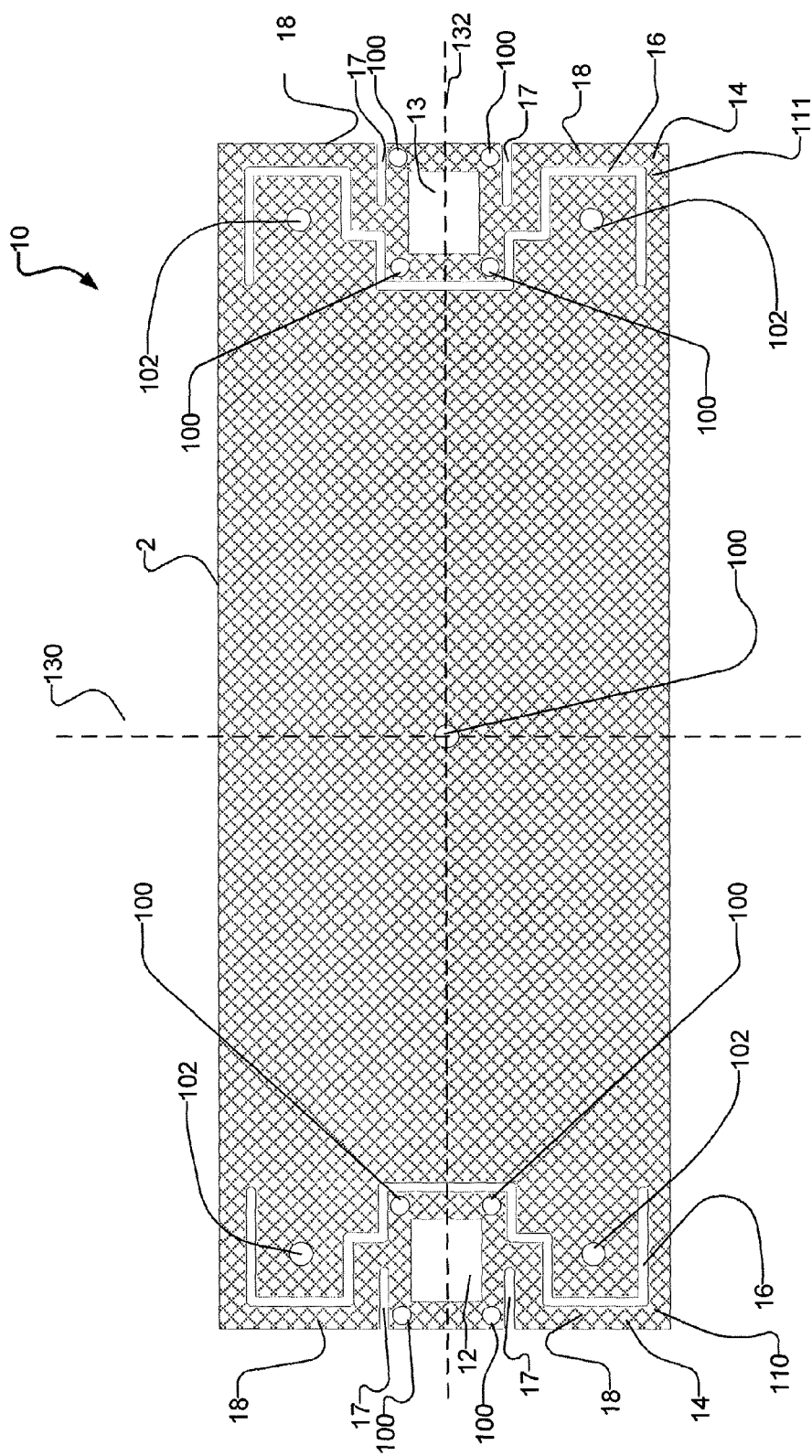
FIG. 1B is a plan view illustrating a first circuit carrier and a second circuit carrier of the circuit-carrying assembly of FIG. 1A.

FIG. 1B is a plan view of circuit-carrying assembly 10 of FIG. 1A illustrating first circuit carrier 12 and second circuit carrier 13. First circuit carrier 12, as shown in FIG. 1A, is on the left hand side of FIG. 1B and second circuit carrier 13 is on the right hand side of FIG. 1B. In this embodiment, second circuit carrier 13 is also coupled to the remainder of substrate 2 by a compliant part 14. Compliant part 14 is formed by aperture 16 and edge cut-outs 17. In this embodiment, second circuit carrier 13 comprises a circuit-carrying island formed by a single aperture 16 and two edge cut-outs 17 extending from the side edge of single circuit-carrying substrate 2. Second circuit carrier 13 is connected to the rest of single circuit-carrying substrate 2 by two compliant substrate bridges 18. Circuit-carrying assembly 10 further comprises rigid support member apertures 100 and case mount apertures 102.

Circuit-carrying assembly 10 is optionally attached to the rigid support member in its portions between first and second circuit carriers 12 and 13. In some embodiments there is a single point of attachment of the control part of circuit carrier assembly 10 to the rigid support member. This point may lie on an axis of symmetry of compliant part(s) 14. In the illustrated embodiment, circuit-carrying assembly 10 optionally comprises rigid support member aperture 100 in the center of circuit-carrying assembly 10 for attaching circuit-carrying assembly 10 to a rigid support member. As illustrated in FIG. 1B, in this embodiment, compliant part 14 (comprising aperture 16, edge cut-outs 17, and compliant substrate bridges 18), first circuit carrier 12, second circuit carrier 13, rigid support member aperture 100, and case mount apertures 102 are arranged such that compliant parts 14 are symmetrical about a central axis 130 of circuit-carrying assembly 10 and an axis 132 extending between first circuit carrier 12 and second circuit carrier 13. An aperture 100 may lie at the intersection of axes 130 and 132 for example.

Symmetrical arrangement of compliant part 14 about an axis 132 results in a compliant part 14 which can allow relative longitudinal movement (e.g. parallel to axis 132) between the parts connected by compliant part 14 without generating torques which might tend to cause rotations of the orientations of circuit carriers on circuit-carrying assembly 10. In some embodiments, compliant part 14 is configured to deform to allow such longitudinal movement while remaining in a plane of circuit-carrying assembly 10.

Figure 1F:
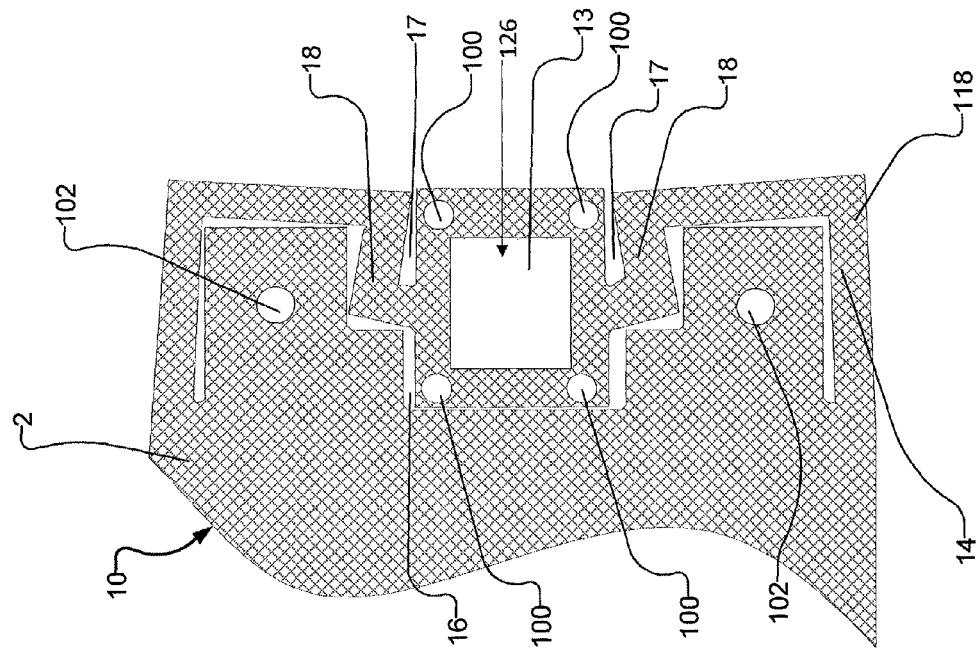
FIG. 1F is a plan view illustrating a compliant part for the second circuit carrier of the circuit-carrying assembly of FIG. 1B in a contracted state.
Figure 1E:
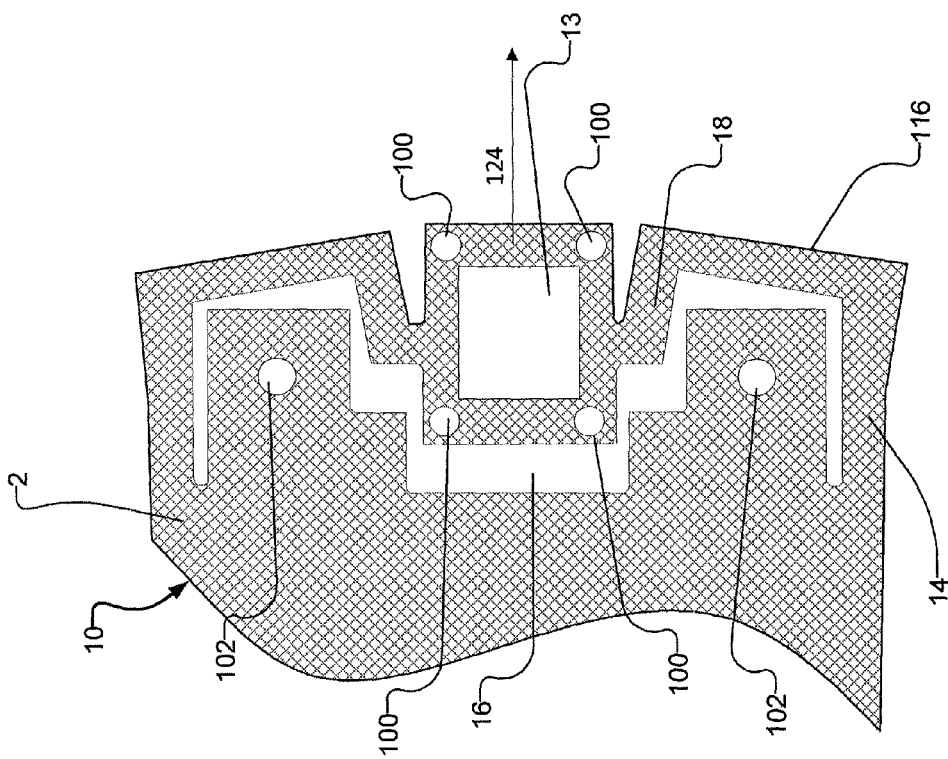
FIG. 1E is a plan view illustrating a compliant part for the second circuit carrier of the circuit-carrying assembly of FIG. 1B in an expanded state.

FIGS. 1C to 1F illustrate the mechanism of action of compliant part 14 of circuit-carrying assembly 10 according to one example embodiment of the invention. FIG. 1C is a plan view illustrating compliant part 14 for first circuit carrier 12 of circuit-carrying assembly 10 of FIG. 1B in an expanded state 112. FIG. 1D is a plan view illustrating compliant part 14 for first circuit carrier 12 of circuit-carrying assembly 10 of FIG. 1B in a contracted state 114. FIG. 1E is a plan view illustrating compliant part 14 for second circuit carrier 13 of circuit-carrying assembly 10 of FIG. 1B in an expanded state 116. FIG. 1F is a plan view illustrating compliant part 14 for second circuit carrier 13 of circuit-carrying assembly 10 of FIG. 1B in a contracted state 118.

Referring to FIG. 1C, a force in direction 120 is exerted on first circuit carrier 12 as a result of expansion of the rigid support member to which first circuit carrier 12 and circuit-carrying assembly 10 are attached relative to circuit-carrying assembly 10. This could occur, for example, if the rigid support member has a greater coefficient of thermal expansion than circuit-carrying assembly 10 and the temperature increases or if the temperature of the rigid support member increases more than circuit-carrying assembly 10 for some reason, or if circuit-carrying assembly 10 has a larger coefficient of thermal expansion than the rigid support member and the temperature decreases. As a result of such force, compliant substrate bridges 18 are flexed to allow first circuit carrier 12 to move in direction 120 as well. Bridges 18 flex easily and so the forces applied to first circuit carrier 12 are relatively low. The area occupied by aperture 16 increases as the compliant substrate bridges 18 move in direction 120 away from the rest of single circuit-carrying substrate 2. Areas occupied by edge cut-outs 17 also increase as a result of the movement of compliant substrate bridges 18.

Movement of compliant substrate bridges 18 reduces the force applied to first circuit carrier 12 such that first circuit carrier 12 is not forced to move relative to the part of the rigid support member to which it is attached. Any fasteners holding first circuit carrier 12 in place are not subjected to excessive forces. Movement of compliant substrate bridges 18 results in compliant part 14 shifting from an original state 110 (as shown in FIGS. 1A and 1B) to the expanded state 112. Movement of compliant substrate bridges 18 also reduces the force applied by circuit carrier 12 to the rigid support member.

Referring to FIG. 1D, a force in direction 122 is exerted on first circuit carrier 12 as a result of contraction of the rigid support member relative to circuit-carrying assembly 10. As a result of such force, compliant substrate bridges 18 are flexed to move in direction 122. The area occupied by aperture 16 decreases as the compliant substrate bridges 18 move in direction 122 into the rest of single circuit-carrying substrate 2. Areas occupied by edge cut-outs 17 also decrease as a result of the movement of compliant substrate bridges 18. Movement of compliant substrate bridges 18 limits the force in direction 122 that is applied to first circuit carrier 12 such that first circuit carrier 12 is not forced to move relative to the part of the rigid support member to which it is attached. This results in compliant part 14 shifting from the original state 110 (as shown in FIGS. 1A and 1B) to the contracted state 114.

Referring to FIG. 1E, a force in direction 124 is exerted on second circuit carrier 13 as a result of relative expansion of the rigid support member to which second circuit carrier 13 and circuit-carrying assembly 10 are attached. As a result of such force, compliant substrate bridges 18 are flexed to move in direction 124. The area occupied by aperture 16 increases as the compliant substrate bridges 18 move in direction 124 away from the rest of single circuit-carrying substrate 2. Areas occupied by edge cut-outs 17 also increase as a result of the movement of compliant substrate bridges 18. Movement of compliant substrate bridges 18 limits the force in direction 124 that is applied to second circuit carrier 13 such that second circuit carrier 13 is not forced to move relative to the part of the rigid support member to which it is attached. This results in compliant part 14 shifting from an original state 111 (as shown in FIG. 1B) to the expanded state 116.

Referring to FIG. 1F, a force in direction 126 is exerted on second circuit carrier 13 as a result of relative contraction of the rigid support member to which second circuit carrier 132 and circuit-carrying assembly 10 are attached. As a result of such force, compliant substrate bridges 18 are flexed to move in direction 126. The area occupied by aperture 16 decreases as the compliant substrate bridges 18 move in direction 126 into the rest of single circuit-carrying substrate 2. Areas occupied by edge cut-outs 17 also decrease as a result of the movement of compliant substrate bridges 18. Movement of compliant substrate bridges 18 limits the force in direction 126 that is applied to second circuit carrier 13 such that second circuit carrier 13 is not forced to move relative to the part of the rigid support member to which it is attached. This results in compliant part 14 shifting from the original state 111 (as shown in FIG. 1B) to a contracted state 118.

To the extent first circuit carrier 12 and second circuit carrier 13 move as a result of expansion or contraction of the rigid support member, such movement is predictable and can be determined from the temperature and the coefficient of thermal expansion of the rigid support member. First and second circuit carriers 12 and 13 can remain rigidly affixed to the rigid support member. Circuit-carrying assembly 10 allows first circuit carrier 12 and second circuit carrier 13 to move together with the parts of the rigid support member to which they are attached without exerting excessive forces on the screws, pins, adhesive, or other attachments holding the first circuit carrier 12 and second circuit carrier 13 to the rigid support member.

Compliant part 14, through aperture 16, compliant substrate bridges 18, and/or edge cut-outs 17, reduces the effective spring constant of the section of single circuit-carrying substrate 2 extending between first circuit carrier 12 and second circuit carrier 13. This prevents first circuit carrier 12 from buckling, slipping or twisting due to mechanical forces caused by differences in thermal expansion between the rigid support member and circuit carrier assembly 10. In one embodiment, the shape and position of compliant substrate bridges 18 are such that they form a non-straight line path over the surface of single circuit-carrying substrate 2 between first circuit carrier 12 and second circuit carrier 13.

Compliant substrate bridges 18 may be shaped such that there are long bridges in circuit-carrying assembly 10 with a minimal waste of area on single circuit-carrying substance 2. In one embodiment, compliant substrate bridges 18 are sufficiently long to accommodate thermal expansion difference between circuit-carrying assembly 10 and a rigid support member nearly the full length of circuit-carrying assembly 10. Preferably, compliant substrate bridges 18 have a ratio of length-to-width in the range of 4 to 20. In some embodiments, compliant substrate bridges 18 may be about 4 mm wide and have a corresponding length of 45 mm or more.

In addition to providing for mounting of imaging chips and/or structured light sources, circuit carriers may comprise other electronic components. For example, components that must be close to image chips for performance reasons, such as noise suppression chips, may be carried on circuit carrier 12 or 13 as well. Circuit carriers 12 and 13 may be formed with patterns of electrical conductors to support such components. In one embodiment, image chips are mounted on circuit carriers. In further embodiments, image chips comprise image sensors. In other embodiments, projector chips (e.g. structured light sources) are mounted on one or more circuit carriers. In yet other embodiments, a combination of projector chips and image chips are mounted on circuit carriers. Components mounted on each of circuit carriers 12 and 13 may be interconnected with one another and/or with other components on circuit-carrying assembly 10 by electrically-conductive traces which extend along bridges 18.

Figure 2A:
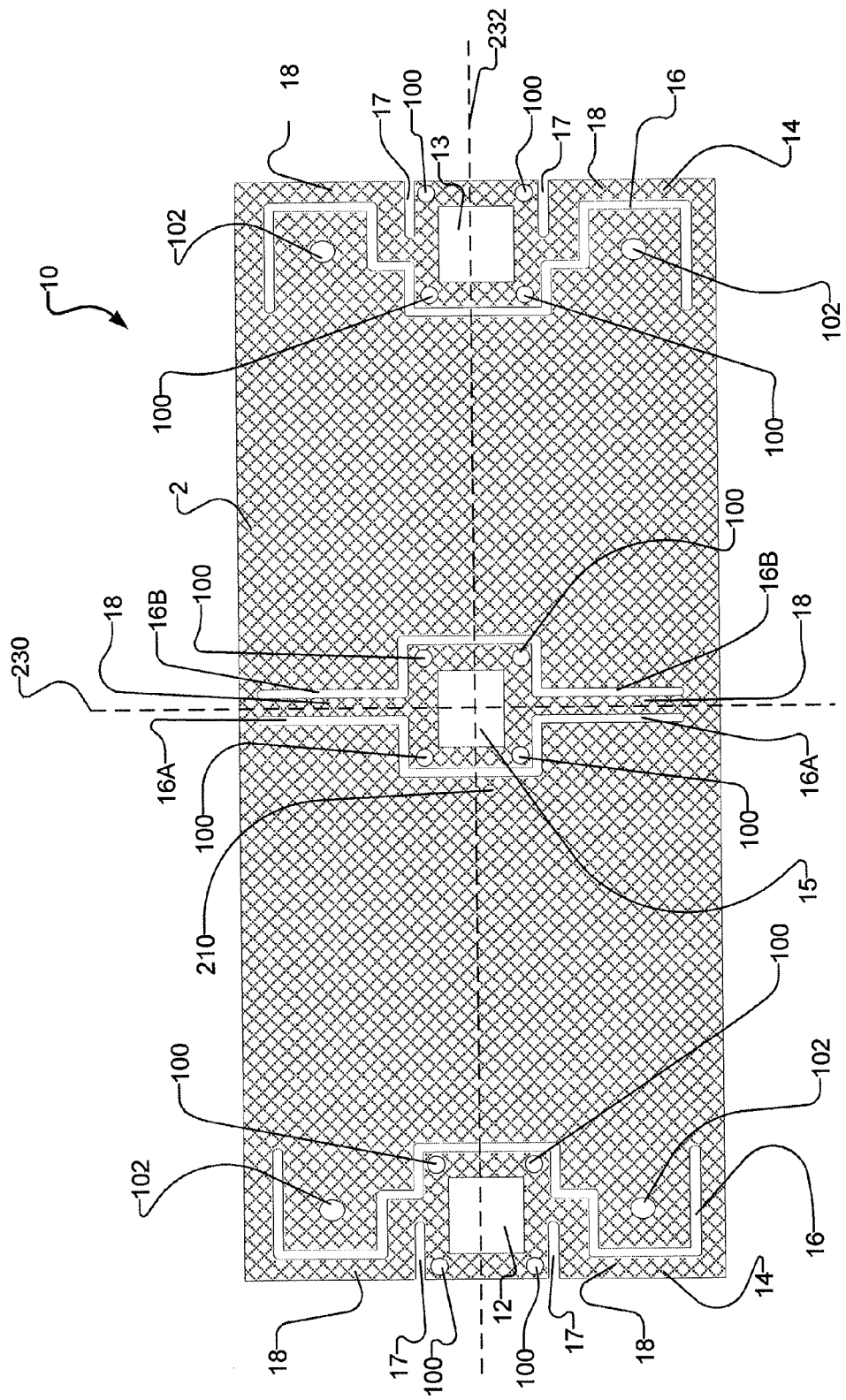
FIG. 2A is a plan view illustrating a circuit-carrying assembly in accordance with another embodiment of the invention.

FIG. 2A illustrates circuit-carrying assembly 10 in accordance with another example embodiment of the invention. In this embodiment, circuit-carrying assembly 10 comprises first circuit carrier 12, second circuit carrier 13, and third circuit carrier 15. First circuit carrier 12, second circuit carrier 13, and third circuit carrier 15 are each coupled to the rest of circuit-carrying assembly 10 by a compliant part 14. In this embodiment, compliant part 14 comprises at least one aperture 16 and at least one compliant substrate bridge 18. In this embodiment, each of first circuit carrier 12 and second circuit carrier 13 comprises a circuit-carrying island formed by a single aperture 16 and two edge cut-outs 17 extending from the side edge of single circuit-carrying substrate 2. Each of first circuit carrier 12 and second circuit carrier 13 is connected to the rest of single circuit-carrying substrate 2 through two compliant substrate bridges 18. Third circuit carrier 15 comprises a circuit-carrying island formed by two apertures 16A and 16B and two compliant substrate bridges 18.

The embodiment of FIG. 2A may be applied, for example, in an embodiment to support three image sensors (one on each of circuit carriers 12, 13, and 15), a structured light source and two image sensors, or two structured light sources and one image sensor.

Circuit-carrying assembly 10 further comprises rigid support member apertures 100 for mounting circuit-carrying assembly 10 to a rigid support member and case mount apertures 102 for mounting one or more cases over circuit-carrying assembly 10. In this embodiment, compliant parts 14 permit relative movement between first circuit carrier 12 and second circuit carrier 13 in a manner similar to that illustrated in FIGS. 1C to 1F.

Figure 2B:
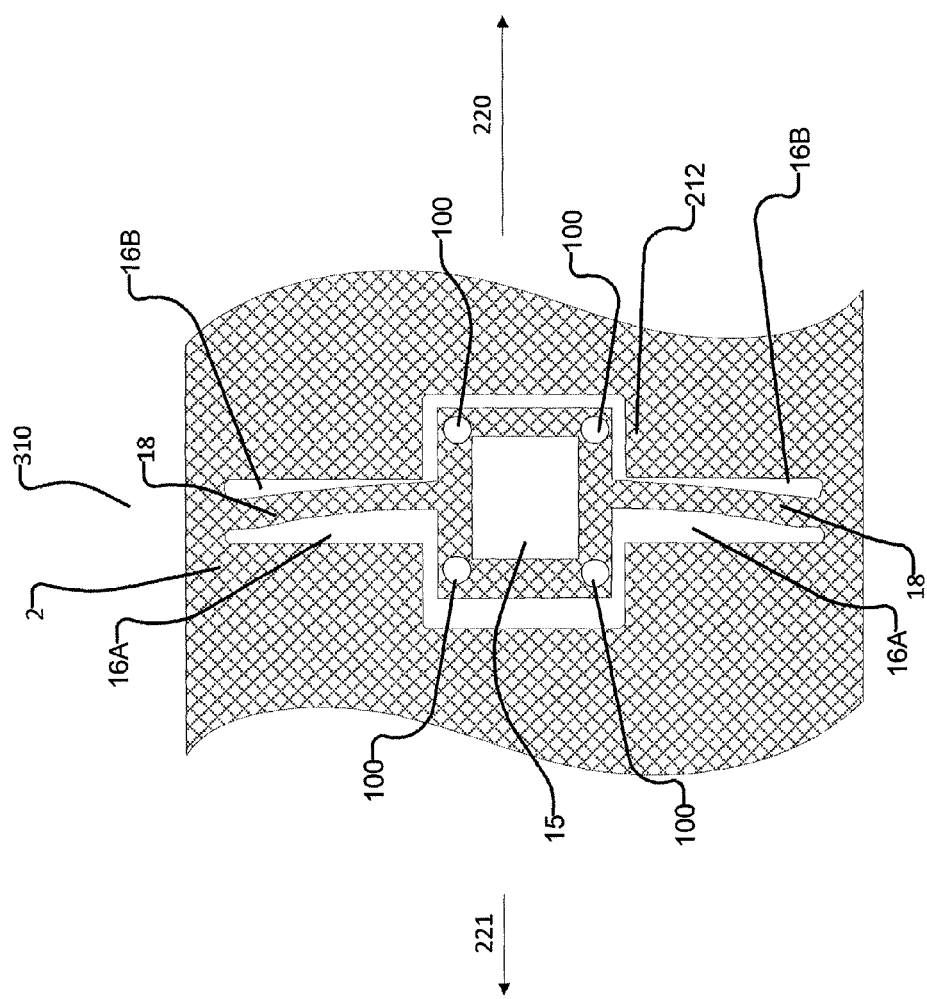
FIG. 2B is a plan view illustrating a compliant part for a third circuit carrier of the circuit-carrying assembly of FIG. 2A in a shifted state.

FIG. 2B is a plan view illustrating compliant part 14 for third circuit carrier 15 of circuit-carrying assembly 10 of FIG. 2A in a shifted state 212. Third circuit carrier 15 is attached to a rigid support member through rigid support member apertures 100. When the rigid support member expands relative to circuit-carrying assembly 10, first and second circuit carriers 12 and 13 are displaced relative to third circuit carrier 15. This results in opposing forces in directions 220 and 221 being exerted on third circuit carrier 15 by way of compliant substrate bridges 18. The forces in directions 220 and 221 may have different strengths. For instance, if there are more heat generating components on one side of circuit-carrying assembly 10, the force exerted on third circuit carrier 15 from that side may be greater. In FIG. 2B, the force in direction 220 is greater than that in direction 221 (as shown by the longer arrows). The net force displaces circuit carrier 15 relative to circuit-carrying substrate 2 in direction 220 and the areas occupied by aperture 16A increase and the areas occupied by aperture 16B decrease. Compliant substrate bridges 18 allow third circuit carrier 15 to remain in substantially the same position as occupied by it before such force is exerted by the rigid support member despite the relative motions of the sides of circuit-carrying assembly 10. Bridges 18 are bent towards direction 220 due to the net force exerted on third circuit carrier 15. This results in compliant part 14 shifting from an original state 210 (as shown in FIG. 2A) to the shifted state 212.

Figure 3C:
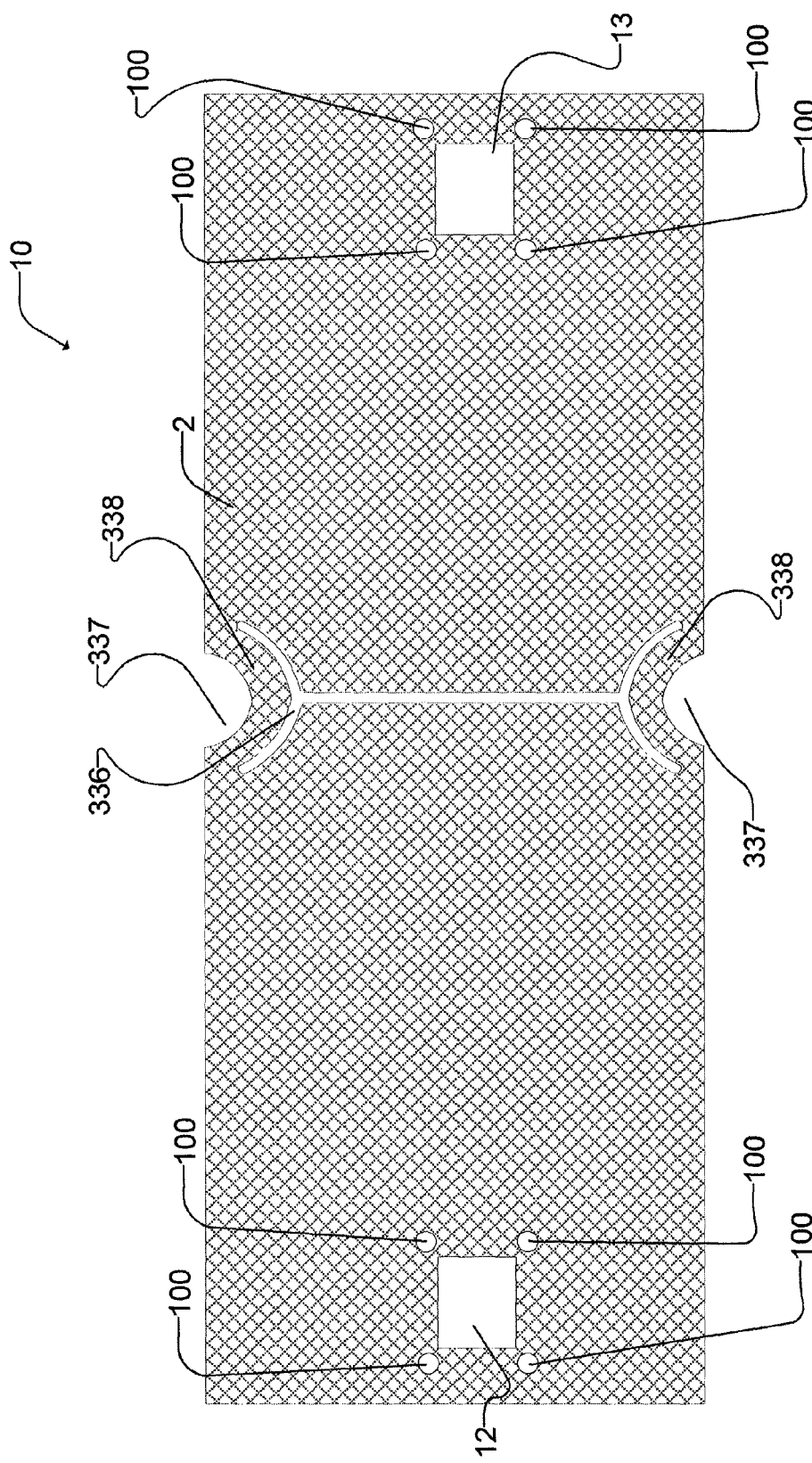
FIG. 3C is a plan view illustrating a circuit-carrying assembly according to an example embodiment of the invention.
Figure 3D:
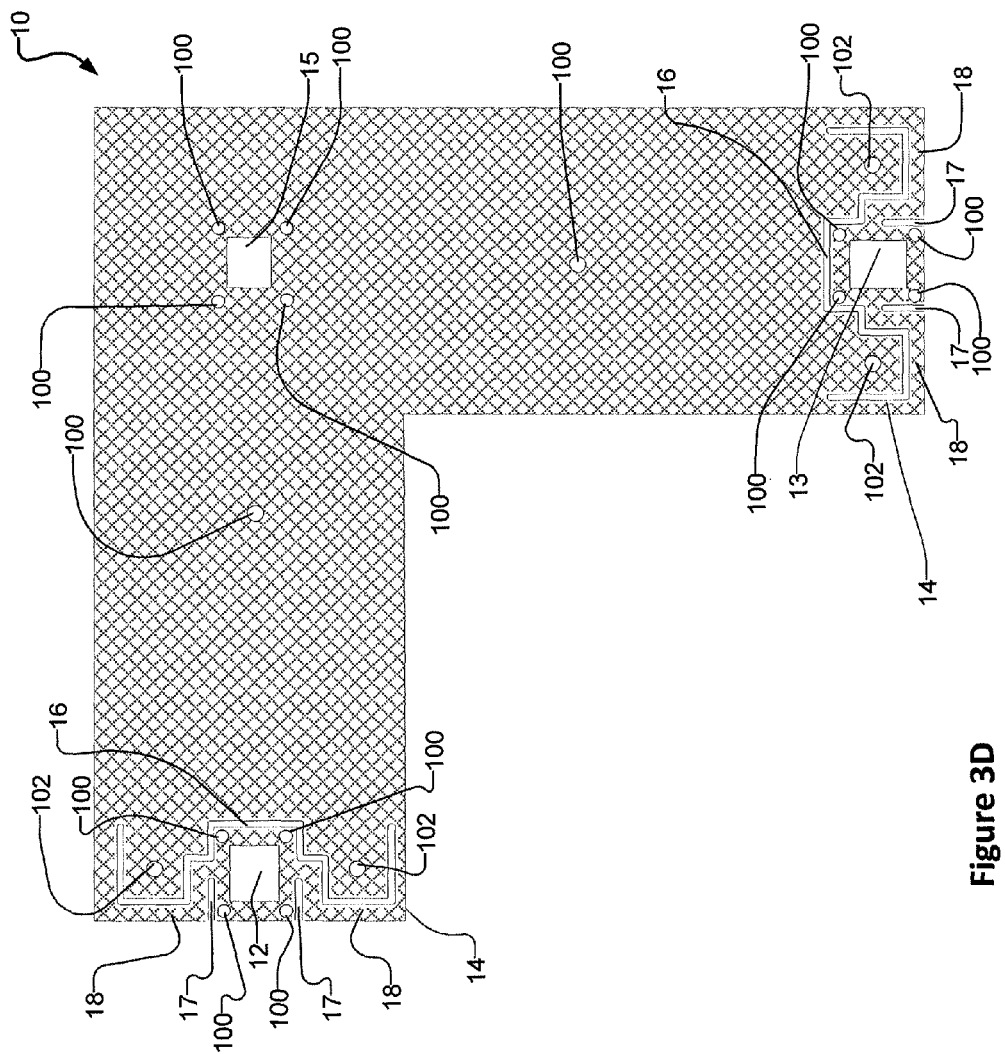
FIG. 3D is a plan view illustrating a circuit-carrying assembly according to an example embodiment of the invention.
Figure 3E:
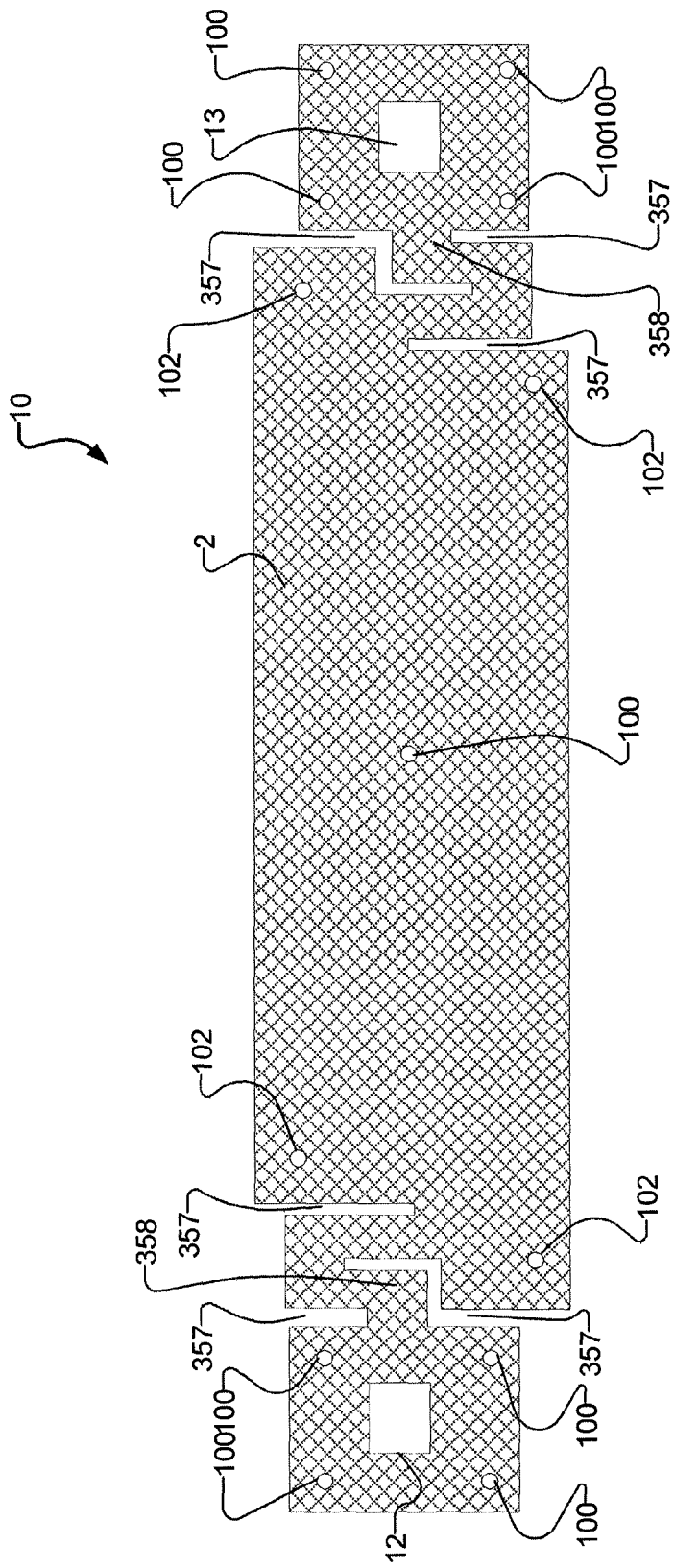
FIG. 3E is a plan view illustrating a circuit-carrying assembly according to another example embodiment of the invention.

FIGS. 3A to 3E illustrate compliant parts of circuit-carrying assemblies according to other example embodiments of the invention. FIG. 3A is a plan view of compliant part 14 of circuit-carrying assembly 10 according to an embodiment of the invention. FIG. 3B is a plan view of compliant part 14 of circuit-carrying assembly 10 according to an embodiment of the invention. FIGS. 3C, 3D, and 3E are plan views of circuit-carrying assembly 10 according to different example embodiments of the invention.

Referring to FIG. 3A, compliant part 14 is coupled to a circuit carrier 300. Compliant part 14 comprises two apertures 16 that surround circuit carrier 300. Apertures 16 are shaped around circuit carrier 300 to form a circuit-carrying island that connects to circuit-carrying assembly 10 through two compliant substrate bridges 18. In this embodiment, compliant part 14 is symmetrical about axis 310 and about axis 312. Rigid support member apertures 100 are found on circuit carrier 300 for mounting circuit carrier 300 to a rigid support member.

FIG. 3B illustrates compliant part 14 of circuit-carrying assembly 10 according to another embodiment of the invention. In this embodiment, compliant part 14 comprises aperture 326 and edge cut-outs 327. Aperture 326 and edge cut-outs 327 form compliant substrate bridges 328, each of which winds back upon itself to join circuit carrier 300 to the rest of single circuit-carrying substrate 2. Aperture 326 and edge cut-outs 327 are shaped around circuit carrier 300 to form a circuit-carrying island that connects to single circuit-carrying substrate 2. In this embodiment, compliant part 14 is symmetrical about an axis 322. In contrast to compliant part 14 shown in FIGS. 1A to 1F, edge cut-outs 327 in this embodiment extend from the upper and lower edges of circuit-carrying assembly 10. Circuit carrier 300 further comprises rigid support member apertures 100 for mounting circuit carrier 300 and circuit-carrying assembly 10 to rigid support member.

FIG. 3C illustrate circuit-carrying assembly 10 according to another example embodiment of the invention. In this embodiment, a compliant part 14 is located in the centre of circuit-carrying assembly 10. Compliant part 14 comprises half circular edge cut-outs 337 and aperture 336 having similar shape at each end to edge cut-outs 337 for forming curved compliant substrate bridges 338. First circuit carrier 12 is located on one side of compliant part 14 and second circuit carrier 13 is located on the other side of compliant part 14.

FIG. 3D illustrates circuit-carrying assembly 10 according to another example embodiment of the invention. In this embodiment, circuit-carrying assembly 10 is in a L-shape with first circuit carrier 12 located near one corner of circuit-carrying assembly 10 and second circuit carrier 13 located near the corner on the other side of circuit-carrying assembly 10. Third circuit carrier 15 is located near the corner in the middle of the L-shape. Circuit-carrying assembly 10 further comprises rigid support member apertures 100 for mounting circuit-carrying assembly 10 to a rigid support member.

Referring to FIG. 3D, first circuit carrier 12, second circuit carrier 13, and third circuit carrier 15 are each coupled to compliant part 14. In this embodiment, compliant part 14 comprises at least one aperture 16 and at least one compliant substrate bridge 18. In this embodiment, each of first circuit carrier 12 and second circuit carrier 13 comprises a circuit-carrying island formed by a single aperture 16 and two edge cut-outs 17 extending from the edge of single circuit-carrying substrate 2. Each of first circuit carrier 12 and second circuit carrier 13 is connected to the rest of single circuit-carrying substrate 2 through two compliant substrate bridges 18.

FIG. 3E illustrates circuit-carrying assembly 10 according to another example embodiment of the invention. In this embodiment, first circuit carrier 12 and second circuit carrier 13 are coupled to compliant part 14, which comprises at least one elongated compliant substrate bridge 358. First circuit carrier 12 is located on one side of compliant part 14 and second circuit carrier 13 is located on the other side of compliant part 14. Each of first circuit carrier 12 and second circuit carrier 13 comprises circuit-carrying islands formed by edge cut-outs 357 extending from the upper and lower edges of circuit-carrying assembly 10. Each of first circuit carrier 12 and second circuit carrier 13 is connected to the rest of single circuit-carrying substrate 2 through elongated substrate bridge 358.

As illustrated in FIGS. 1B to 1F, expansion or contraction of the rigid support member relative to circuit carrier 10 exerts forces on first circuit carrier 12 and second circuit carrier 13. Compliant part 14, allows first circuit carrier 12 to move relative to second circuit carrier 13 (in this example embodiment by movement of compliant substrate bridges 18). This allows first circuit carrier 12 and second circuit carrier 13 to maintain their positions relative to the parts of the rigid support member to which they are attached while keeping the forces exerted between the rigid support member and the first and second circuit carriers lower than they would otherwise be.

Circuit-carrying assembly 10 further comprises rigid support member apertures 100 for mounting circuit-carrying assembly 10 to a rigid support member and case mount apertures 102 for mounting one or more cases over circuit-carrying assembly 10.

In the embodiments illustrated in FIGS. 1A to 1F, 2A to 2B, and 3A to 3D, compliant substrate bridges 18, 328 (in FIG. 3B), or 338 (in FIG. 3C), as applicable, are formed by at least one aperture 16, 326 (in FIG. 3B), or 336 (in FIG. 3C), as applicable, with or without edge cut-outs 17, 327 (in FIG. 3B), or 337 (in FIG. 3C), as applicable, in single circuit-carrying substrate 2. In the embodiment illustrated in FIG. 3E, compliant substrate bridges 358 are formed with edge cut-outs 357 in single circuit-carrying substrate 2. Circuit-carrying substrate 2 may comprise, for example, a fiberglass circuit board patterned with electrically-conducting traces. Circuit carriers and compliant part 14 may be integral to the same unitary sheet of circuit board material. In other embodiments, compliant substrate bridges 18 may comprise other materials known to a person skilled in the art in light of the present disclosure.

In the embodiments illustrated in FIGS. 1A to 1F, 2A to 2C, and 3A to 3E, each of the circuit-carrying assemblies comprises a circuit-carrying substrate. In other embodiments, circuit-carrying assembly comprises a plurality of separate circuit-carrying substrates connected to form an assembly.

Single circuit-carrying substrate 2 may be made of any suitable material known to a person skilled in the art in light of the present disclosure. In one embodiment, single circuit-carrying substrate 2 may comprise one or more layers of fibre material impregnated with a suitable resin. Circuit-carrying substrate 2 may comprise a multi-layer circuit board having patterns of electrically-conductive traces in two, three, or more layers.

Circuit-carrying assemblies according to other embodiments of the invention may also reduce forces on circuit carriers (e.g., first circuit carrier 12, second circuit carrier 13, and third circuit carrier 15) resulting from mechanical forces exerted on circuit-carrying assemblies by the mounting of enclosures or other components onto circuit-carrying assemblies, including mechanical forces resulting from thermal expansion of such enclosures.

Circuit-carrying assemblies as described herein may be incorporated into stereoscopic or other 3D camera systems. An imaging system according to an embodiment of the invention comprises two chips mounted on a common circuit-carrying assembly. In one embodiment, the chips comprise imaging chips. In other embodiments, one of the chips is a projector chip. In an example embodiment a circuit-carrying assembly comprises a multi-layer circuit board cut to provide a plurality of circuit-carriers having compliant regions comprising bridges located between adjacent ones of the circuit-carriers and populates with electronic components including at least one imaging chip on a first one of the plurality of circuit-carriers and another imaging chip or a projector chip on a second one of the plurality of circuit-carriers. Fixing means are provided to fix the first and second circuit-carriers to a support member or members. These means may comprise apertures, fasteners, screws, clips, adhesive, clamps, or the like. In some embodiments the fixing means hold the first and second circuit carriers against rotation relative to the support member or members. Other electronic components such as memory, processors, firmware and data communication may be provided on the circuit-carrying assembly. The circuit carrying assembly may be made using conventional printed circuit fabrication techniques. The circuit-carrying assembly may support all or substantially all electronic components of a stereoscopic or other 3D camera system.

The imaging chips may be of any suitable technology. The imaging chips may comprise, for example, CCD (charge coupled device) imaging chips, APS (active pixel sensors), CMOS sensors, infrared imaging sensors, or the like. The projector chip may, if present, be of any suitable technology and may emit any suitable wavelength of light detectable by an imaging chip in a pattern suitable for providing structured light illumination.

Imaging systems may further comprise a rigid support to which a circuit-carrying assembly is mounted. The rigid support may, for example, comprise a plate, bar, or the like. In some embodiments, the support comprises a metal such as aluminium, steel, copper, or the like. The rigid support member may comprise any suitable material known to a person skilled in the art in light of the present disclosure. In one embodiment, the rigid support member comprises a thermally conductive material, such as a metal (e.g. aluminium, steel, copper, or the like). In other embodiments, the rigid support member comprises a metal alloy.

A rigid support member may also comprise apertures corresponding to the circuit carriers. Lens carriers and camera lenses may be mounted in or adjacent to the apertures. Lens carriers may be mounted on and/or fabricated as the rigid support member in a manner such that lenses supported by the lens carriers are positioned to focus light onto imaging chips.

Preferably, the rigid support member has a second moment of inertia sufficiently large to limit bending of the rigid support member due to mechanical forces. Also, preferably, expansion or contraction of the rigid support member is unconstrained by circuit-carrying assembly 10 (due to the presence of one or more compliant parts 14 as described above). The likelihood of any significant bending of the rigid support member may be further reduced by mounting circuit-carrier assembly 10 close to the rigid support member. By doing so one can reduce the effective length of the stand-off portion of the bar between the main length of the bar, and circuit-carrying assembly 10 (e.g. reducing the distance between circuit-carrying assembly 10 and a neutral axis of the resilient member). Making circuit-carrier assembly 10 close to the rigid support member reduces the mechanical advantage by which forces exerted on attachment points by circuit-carrier assembly 10 could act to bend the rigid support member.

Figure 4A:
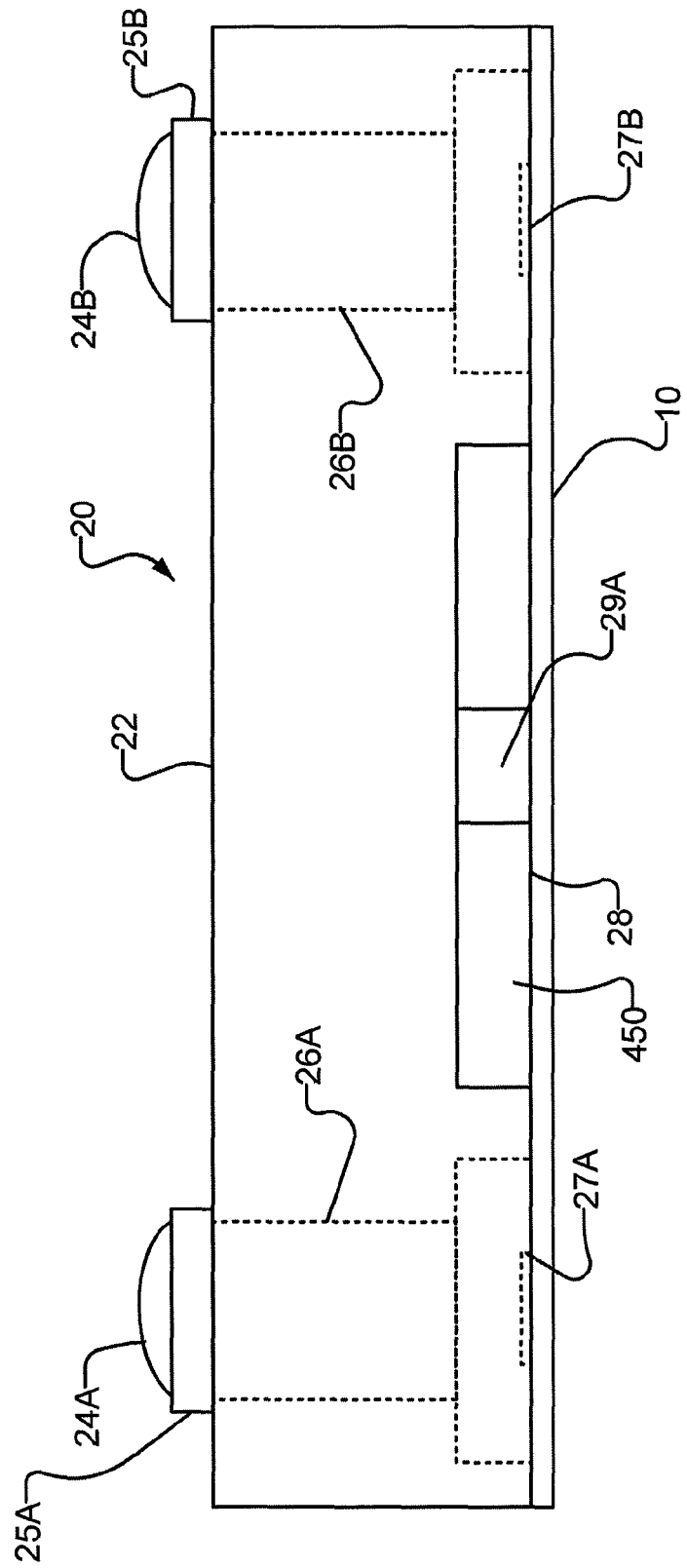
FIG. 4A is a plan view illustrating an imaging system that incorporates a circuit-carrying assembly according to an example embodiment of the invention.

FIG. 4A is a plan view of an imaging system 20 that incorporates circuit-carrying assembly 10 according to an example embodiment of the invention. Imaging system 20 comprises a rigid support member 22 and lens carriers 25A and 25B. Lens carriers 25A and 25B are mounted in rigid support member 22 by way of lens carrier apertures 26A and 26B, respectively, within rigid support member 22. Lenses 24A and 24B are mounted in lens carriers 25A and 25B, respectively. Lenses 24A and 24B, respectively, focus light onto imaging chips 27A and 27B which are mounted on a circuit-carrying assembly 10 which is attached to rigid support member 22.

In one embodiment, circuit-carrying assembly 10 is mounted onto rigid support member 22 by way of screws which pass through rigid support member apertures 100 (as illustrated in FIGS. 1A to 1F, 2A to 2B, and 3A to 3E). In other embodiments, the mounting of circuit-assembly 10 to rigid support member 22 may be achieved by way of adhesives, pins or other fasteners known to a person skilled in the art in light of the present disclosure. In yet other embodiments, the mounting may be achieved through a combination of different types of fasteners.

In one embodiment, circuit-carrying assembly 10 is mounted onto rigid support member 22 at locations near imaging chips 27A and 27B. Circuit-carrying assembly 10 is also mounted onto rigid support member 22 at its central portion 29A in some embodiments. Circuit-carrying assembly 10 comprises a compliant part 14 between imaging chips 27A and 27B.

Rigid support member 22 may optionally comprise a recess 450. Recess 450 may provide clearance for components that project toward the rigid support member 22 from circuit-carrying assembly 10. In one embodiment, circuit-carrying assembly 10 extends over recess 450. Central portion 29A may also extend over recess 450. Preferably, any gaps between circuit-carrying assembly 10 and rigid support member 22 are kept minimal so that circuit-carrying assembly 10 is close to rigid support member 22 so as to reduce bending of rigid support member 22.

In some embodiments, thermally conductive paths 28 are provided across the gap between rigid support member 22 and circuit-carrying assembly 10. These thermally conductive paths 28 may be provided between individual components on circuit-carrying assembly 10 and rigid support member 22 in some embodiments. Thermally conductive paths 28 may assist in equalizing temperatures of circuit-carrying assembly 10 and rigid support member 22, thereby reducing differential expansion of these components. Thermally conducive paths 28 may transfer heat from one or more heat-generating components (e.g. a processor chip) on circuit-carrying assembly 10 into rigid support member 22, which may act as a heat sink.

As illustrated in FIG. 4A, a thermally conductive path 28 may be provided by a rigid mount point at a location near a midpoint between two points of attachment of circuit-carrying assembly 10 to rigid support member 22. A rigid mount point can be used at the midpoint because there may be relatively little position change between a point on rigid support member 22 and a corresponding point on circuit-carrying assembly 10 as temperatures change. A thermally conductive path 28 may also, for example, be provided by a paste, resilient pad, or the like that can accommodate some relative motion between circuit-carrying assembly 10 and rigid support member 22.

Figure 4B:
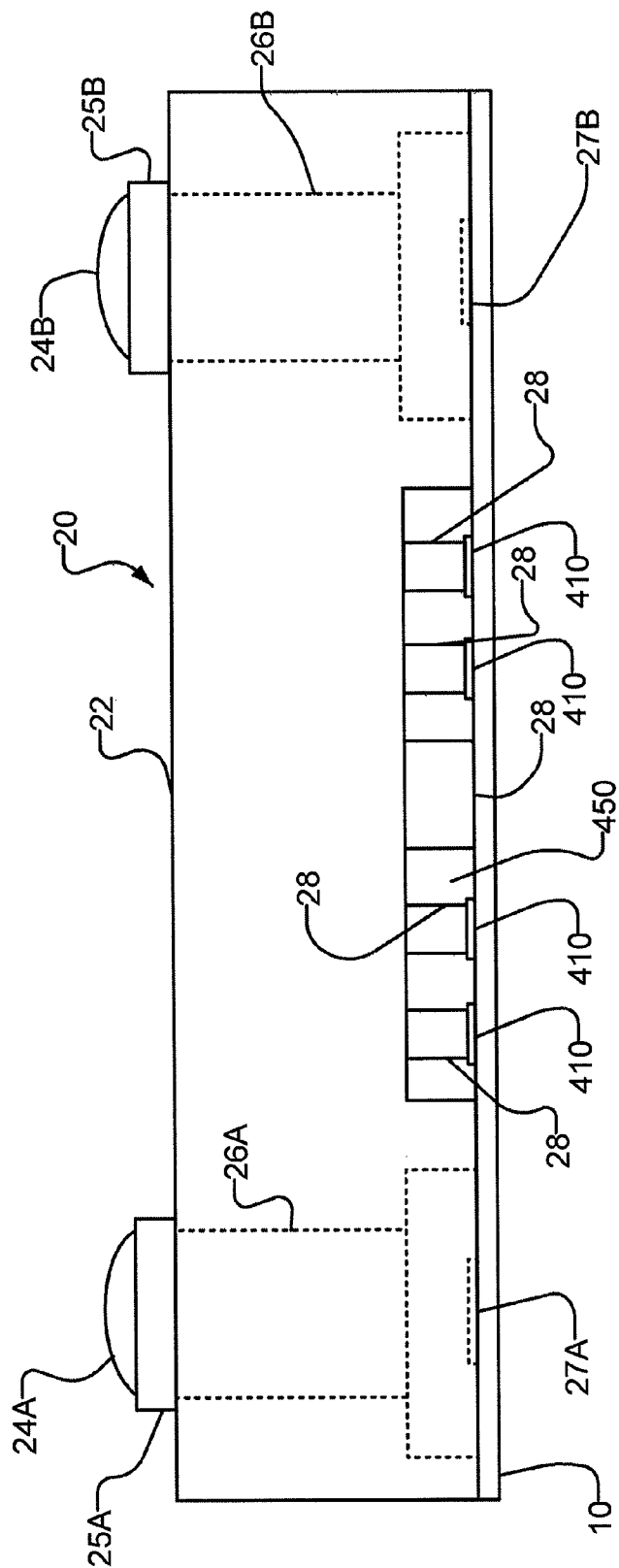
FIG. 4B is a plan view illustrating an imaging system that incorporates a circuit-carrying assembly according to an example embodiment of the invention.

FIG. 4B is a plan view of an imaging system 20 that incorporates circuit-carrying assembly 10 according to an embodiment of the invention. Imaging system 20 comprises a rigid support member 22 and lens carriers 25A and 25B. Lens carriers 25A and 25B are mounted in rigid support member 22 by way of lens carrier apertures 26A and 26B, respectively, within rigid support member 22. Lenses 24A and 24B are mounted in lens carriers 25A and 25B. Lenses 24A and 24B, respectively, focus light onto imaging chips 27A and 27B which are mounted on circuit-carrying assembly 10. In this embodiment, heat generating components 410 on circuit-carrying assembly 10 are connected to thermally conductive paths 28 which transfer heat from heat generating components 410 to rigid support member 22. Imaging system 20 further comprises thermally conductive path 28 through midpoint of rigid support member 22 connected to circuit-carrying assembly 10.

In one embodiment, thermally conductive paths 28 comprise thermally conductive compliant filler. In other embodiments, thermally conductive paths 28 comprise heat sinks. In yet other embodiments, thermally conductive paths 28 comprise any heat conductive material known to a person skilled in the art in light of the present disclosure or a combination of different conductive materials. In other embodiments, thermally conductive paths 28 comprise materials which also dampen vibrations of circuit-carrying assembly 10 relative to the rigid support member.

In some embodiments, circuit-carrying assembly 10 is recessed into rigid support member 22 such that the points of attachment of circuit-carrying assembly 10 to rigid support member 22 are close to a centroid of rigid support member 22. At these locations, any forces applied by circuit-carrying assembly 10 to rigid support member 22 are less likely to cause bending of rigid support member 22.

Figure 4C:
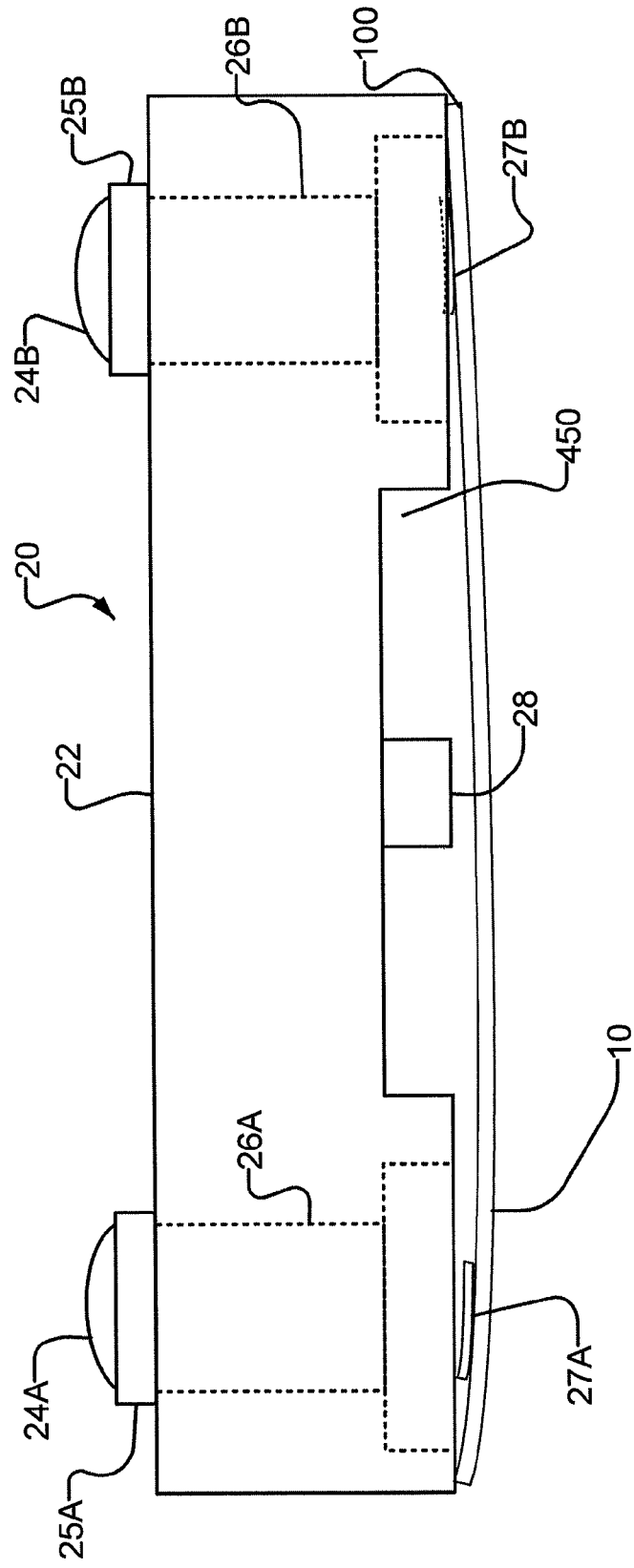
FIG. 4C is a plan view illustrating an imaging system having a circuit-carrying assembly wherein the circuit-carrying assembly does not have a compliant part.

FIG. 4C is a plan view of imaging system 20 wherein circuit-carrying assembly 10 does not have compliant part 14. Without the actions of compliant part 14, circuit-carrying assembly 10 may deform such that imaging chips 27A and 27B are moved out of alignment with lenses 24A and 24B in response to differential expansion or contraction of circuit-carrying assembly 10 and rigid support member 22. Furthermore, deformation of circuit-carrying assembly 10 may cause unpredictable movements of image chips 27A and 27B such that errors, such as stereo errors or the like, are introduced when images from such chips are processed as normal calibration would no longer be usable.

Figure 4D:
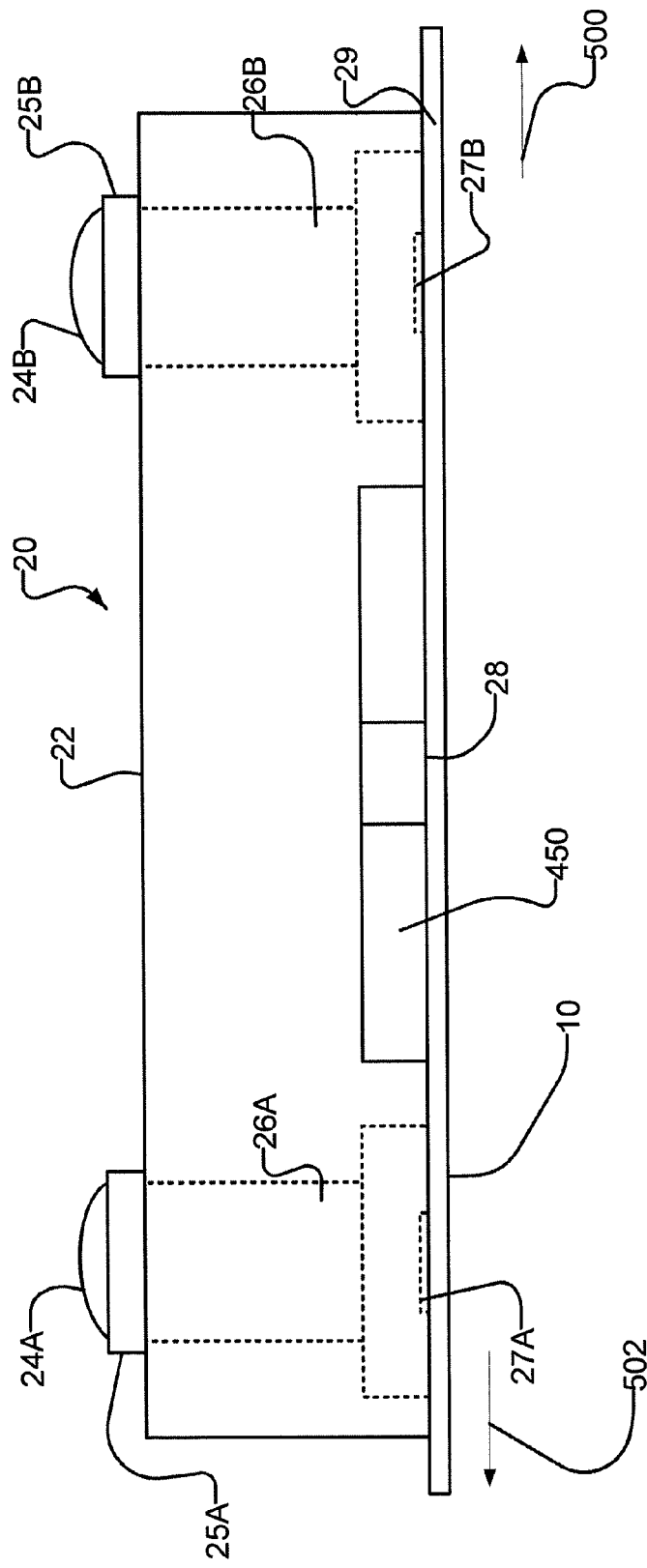
FIG. 4D is a plan view illustrating an imaging system having a circuit-carrying assembly wherein the circuit-carrying assembly has a compliant part according to an example embodiment of the invention.

FIG. 4D is a plan view of imaging system 20 wherein circuit-carrying assembly 10 has compliant part 14. In this embodiment, as rigid support member 22 expands, forces in directions 500 and 502 are exerted on circuit-carrying assembly 100. Due to the presence of compliant part 14, circuit-carrying assembly 100 allows image chips 27A and 27B to remain substantially in the same position relative to the portions of the rigid support member 22 to which they are attached. The calibration of imaging system 20 is therefore affected by thermal expansion of rigid support member 22 in a completely predictable manner. Providing at least one compliant part 14 in circuit-carrying assembly 10 between imaging chips 27A and 27B allows imaging chips 27A and 27B to remain in locations relatively fixed to rigid support member 22 even where there are relative changes in dimension of support member 22 and circuit-carrying assembly 10. Compliant part 14 reduces forces that could otherwise cause imaging chips 27A and 27B to move relative to lens carriers 26A and 26B.

The principles of connecting circuit-carrying islands with compliant substrate bridges described above may be applied in imaging systems having a wide variety of configurations. For example, FIGS. 2A and 3D show example circuit-carrying assemblies 10 which may be used in imaging systems having three imaging chips. FIG. 2A shows a plan view of a circuit-carrying assembly 10 for imaging system 20 where three imaging chips are arranged in a line. FIG. 3D shows a plan view of a circuit-carrying assembly 10 for imaging system 20 in which three imaging chips are arranged in an L-shape.

Apparatus according to some embodiments includes one or more temperature sensors which monitor temperatures in a rigid support. A processor may be configured to adjust a calibration of the apparatus based on the monitored temperatures. The changes in calibration may be based on a known coefficient of thermal expansion of the rigid support.

In an example embodiment, imaging system 20 comprises two lenses 24A and 24B and imaging chips 27A and 27B mounted on circuit-carrying assembly 10. Lenses 24A and 24B with imaging chips 27A and 27B, respectively, form camera systems to image objects in an image area. Image data of the imaged objects can be processed by a processor in ways known to a person skilled in the art in light of the present disclosure to identify and match features present in the taken images. Relative positions of features in the image data are processed to identify 3-D positions of the features of the imaged objects. Imaging system 20 may be calibrated based on a set of known distances between camera systems and the imaged objects. The calibration data is stored in memory of imaging system. As long as positions and orientations of imaging chips 27A and 27B/lenses 24A and 24B stay fixed, the calibration would be correct. Actual processing may be done at imaging system 20 or on computer system to which imaging system 20 transmits image data or some can be done at imaging system 20 and additional processing somewhere else.

In another embodiment, one set of lens/image sensor is replaced by a structured light source which projects patterns of light (e.g. stripes) on objects in the field of view of imaging system 20. Positions of the stripes in the captured image depend on 3D positions of objects being imaged. The remaining lens/image sensor can capture an image of the objects and the image data can be processed to determine 3D positions of such objects using stored calibration data. As long as positions and orientations of the lens/image sensor and a structured light source remain the same, then the calibration would remain correct.

Figure 5A:
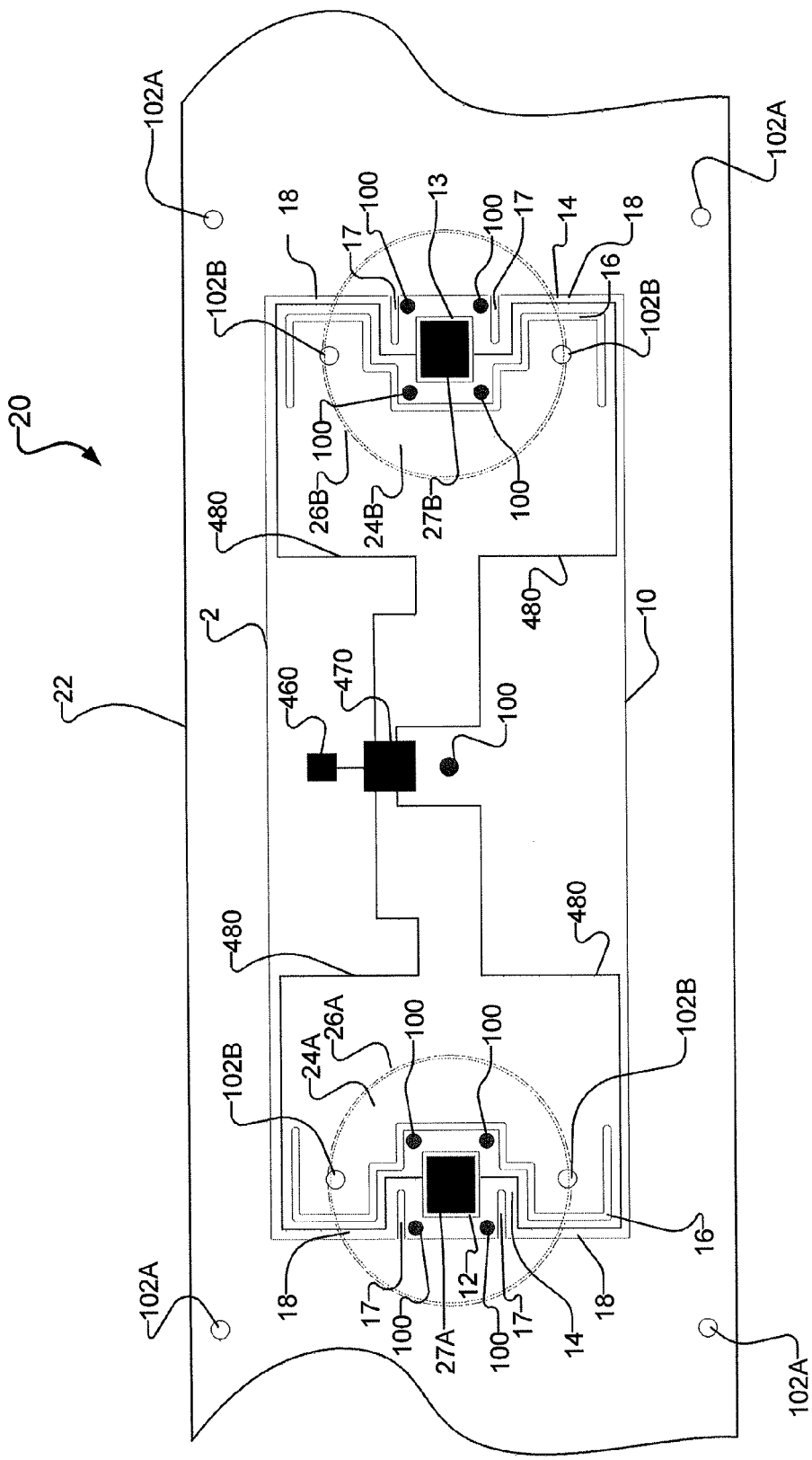
FIG. 5A is a plan view illustrating an imaging system having a circuit-carrying assembly according to an example embodiment of the invention.

FIG. 5A is a plan view illustrating imaging system 20 according to an embodiment of the invention. In this embodiment, imaging system 20 comprises circuit-carrying assembly 10, rigid support member 22, imaging chips 27A and 27B, lens 24A and 24B, temperature sensor 460, a processor 470, and electrically conductive traces 480. Circuit-carrying assembly 10 comprises first and second circuit carriers 12 and 13, compliant part 14, rigid support member apertures 100, and case mount apertures 102A and 102B. Compliant part 14 comprises compliant substrate bridges 18 defined by aperture 16 and edge cut-outs 17. Rigid support member 22 comprises lens carriers 26A and 26B. Imaging chips 27A and 27B are mounted on first circuit carrier 12 and second circuit carrier 13, respectively. Traces 480 travel over compliant substrate bridges 18 and connect each of imaging chips 27A and 27B to processor 470. Traces 480 allow data, such as image data, to be transferred from imaging chips 27A and 27B to processor 470. Lens 24A and 24B are mounted onto rigid support member 22 through lens carrier 26A and 26B, respectively, and mounted over imaging chips 27A and 27B, respectively. Circuit-carrying assembly 10 is mounted onto rigid support member 22 by way of fasteners mounted through rigid support member apertures 100 on circuit-carrying assembly 10.

In this embodiment, temperature sensor 460 is mounted on circuit-carrying assembly 10. Temperature sensor 460 may also be mounted on rigid support member 22 or operatively connected to circuit-carrying assembly 10 and rigid support member 22 in other ways. In other embodiments, more than one temperature sensor 460 is mounted on, or operatively connected to, multiple locations on circuit-carrying assembly 10. Temperature sensor 460 provides information about the temperature of one or more regions on circuit-carrying assembly 10, including heat-generating components mounted on circuit-carrying assembly 10 such as processor 470. Temperature sensor 460 may also provide temperature information on rigid support member 22.

Temperature sensor 460 provides temperature information about one or more regions on circuit-carrying assembly 10 to processor 470 on circuit-carrying assembly 10. Processor 470 then uses the temperature information provided by temperature sensor 460 to adjust calibration of the image data from image sensors in imaging system 20. The calibration adjustment may be calculated by processor 470 based on a coefficient of thermal expansion of rigid support member 22. In another embodiment, processor 470 adjusts the calibration based on pre-set values in a lookup table. In other embodiments, calibration may be done by separate processors not mounted on circuit-carrying assembly 10 (e.g. by a separate computing device).

Figure 5B:
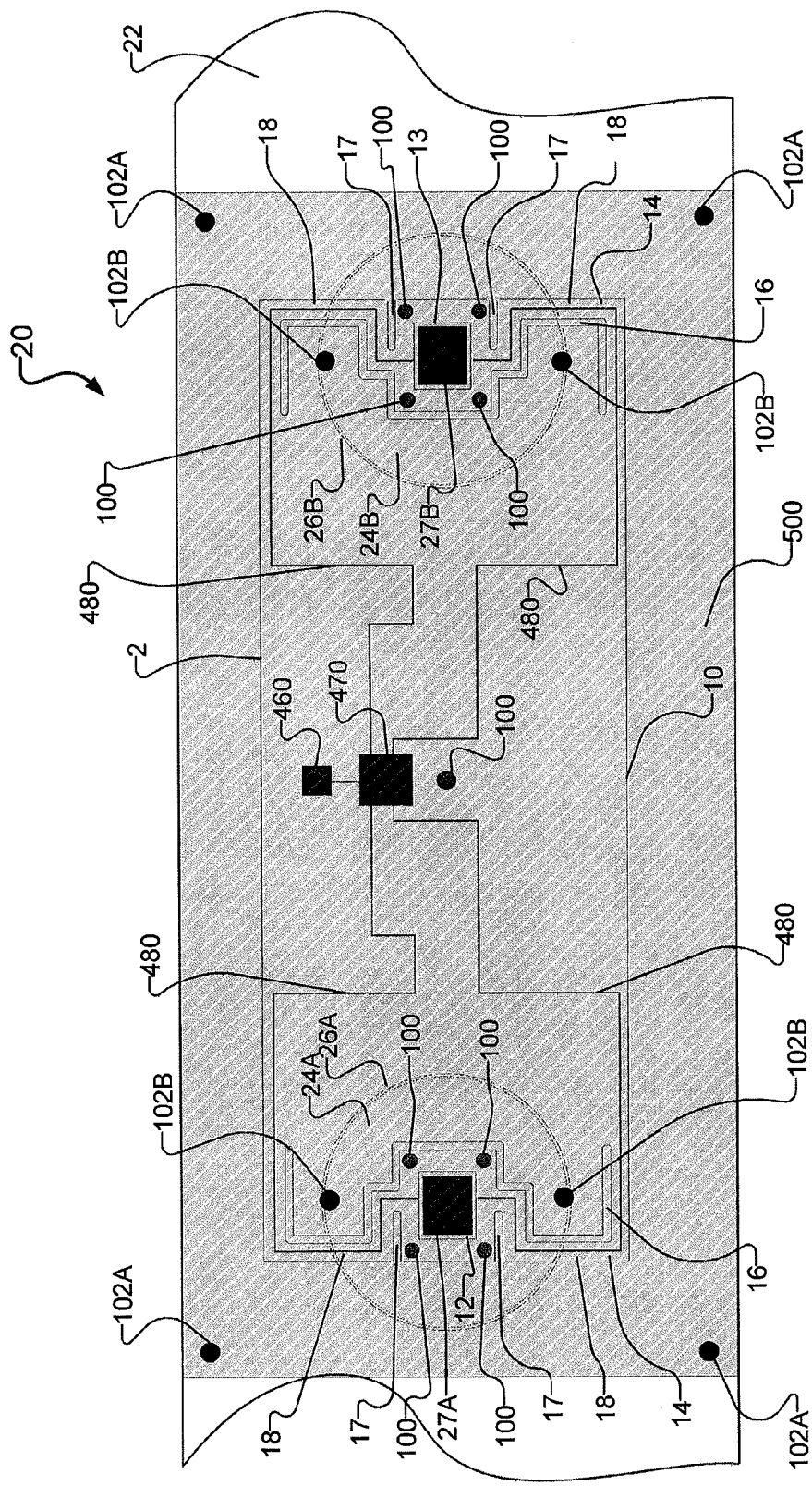
FIG. 5B is a plan view of the imaging system of FIG. 5A with a case mounted onto the circuit-carrying assembly and rigid support member.

FIG. 5B is a plan view illustrating imaging system 20 of FIG. 5A mounted with a case 500. Case 500 provides shielding to protect circuit-carrying assembly 10 and all components mounted on circuit-carrying assembly 10 (e.g. imaging chips 27A and 27B, processor 470, etc.). In this embodiment, case 500 is mounted directly onto rigid support member 22 by way of fasteners (e.g. screws or the like) mounted through case mount apertures 102A. Case 500 is also mounted onto circuit-carrying assembly 10 and rigid support member 22 by way of fasteners (e.g. screws or the like) mounted through case mount apertures 102B. In some embodiments, case mount apertures 102B comprise rubber grommets to allow soft mounting of case 500 to rigid support member 22. Case 500 may comprise thermally conductive members connected to circuit-carrying assembly 10 such that heat generated by heat generating components on circuit-carrying assembly 10 is transferred to case 500.

Figure 5C:
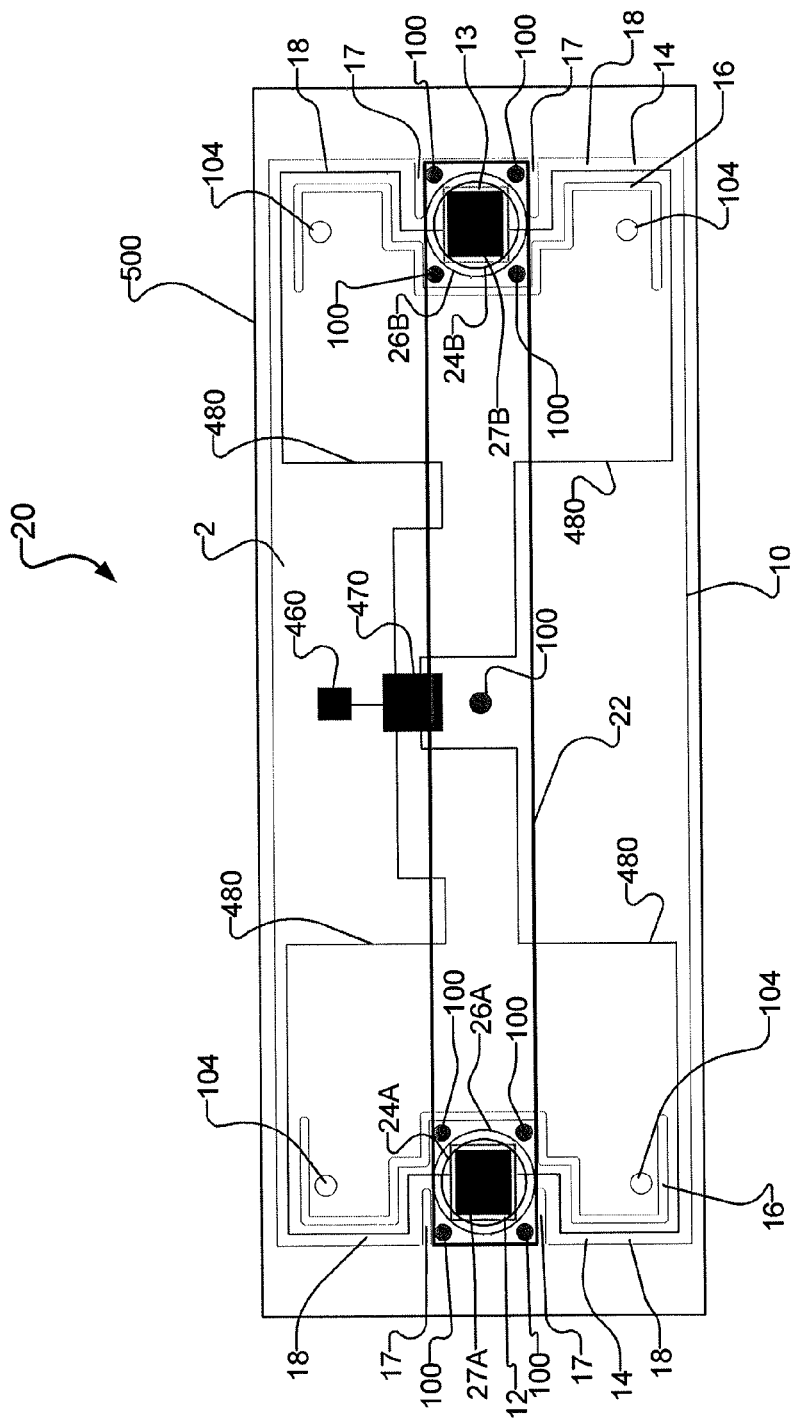
FIG. 5C is a plan view of an imaging system with a case mounted onto the circuit-carrying assembly according to another example embodiment of the invention.

FIG. 5C is a plan view of an imaging system 20 mounted with case 500 according to another embodiment. In this embodiment, rigid support member 22 extends between first circuit carrier 12 and second circuit carrier 13, but does not cover the entirety of circuit-carrying assembly 10. Rigid support member 22 is mounted onto circuit-carrying assembly 10 by way of fasteners (e.g. screws or the like) mounted through rigid support member apertures 100. Circuit-carrying assembly 10 is mounted onto case 500 by way of fasteners (e.g. screws or the like) mounted through case mount apertures 104. In some embodiments, case 500 comprises a molded plastic case, and the plastic used for case 500 has a thermal expansion coefficient greater than that of rigid support member 22 and circuit-carrying assembly 10. In this embodiment, case 500 does not exert any significant force on rigid support member 22 or the circuit carrying islands of first circuit carrier 12 and second circuit carrier 13. This embodiment may be manufactured at lower cost, when compared to other embodiments in which rigid support member 22 extends across the entirety of circuit-carrying assembly 10.

Figure 6:
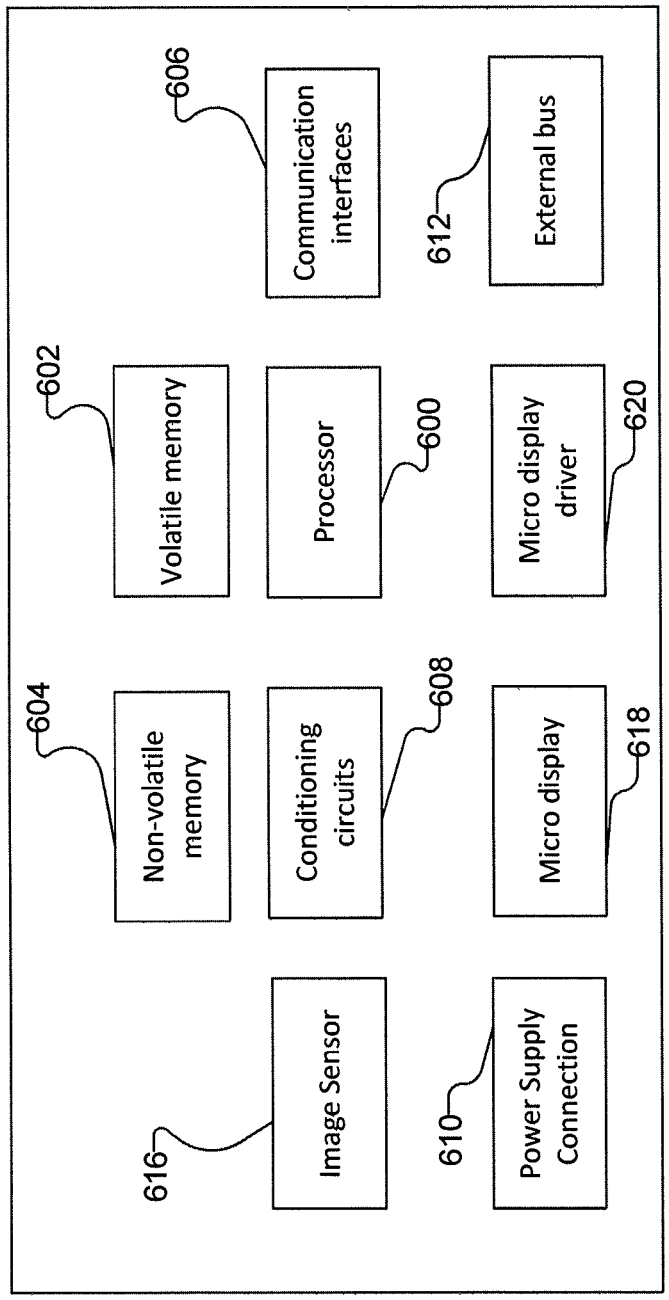
FIG. 6 is a schematic view illustrating a circuit-carrying assembly according to an example embodiment of the invention.

In some embodiments, circuit-carrying assembly 10 comprises other components known to a person skilled in the art in light of the present disclosure. Referring to FIG. 6, circuit-carrying assembly 10 comprises processor 600, volatile memory 602, non-volatile memory 604, communication interfaces 606, power supply connection 610, external bus 612, and image sensor 616. Processor 600 comprise microprocessors for executing instructions from software installed on non-volatile memory 604, including, for example, firmware. Power supply connection 610 connects circuit-carrying assembly 10 to the electrical supply. Volatile memory 602 may serve as a buffer for processor 600 when image data is sent by image sensor 616. Volatile memory 602 may also serve as buffer to processor 600 when it processes image data. In one embodiment, processed image data is stored in non-volatile memory 604. In other embodiment, processed image data is stored in volatile memory 602. In other embodiments, processed image data is stored in both non-volatile memory 604 and volatile memory 602. Communication interfaces 606 may comprise wireless networking modules that comply with networking standards such as IEEE 802.15 (otherwise known as Bluetooth), IEEE 802.11 (otherwise known as Wi-Fi), near-field communication (NFC), cellular network connectivity standards including CDMA (code division multiple access) and variants thereof, GSM (Global System for Mobile Communications), GPRS (General Packet Radio System), 3G and 3.5G systems such as UMTS (Universal Mobile Telecommunication Service) systems, Internet Protocol (IP) Wireless Wide Area Networks like 802.16, 802.20, HSDPA (High Speed Downlink Packet Access) systems, 4G systems such as LTE (Long Term Evolution), or the like.

Communication interfaces 606 may comprise wired networking modules that comply with IEEE 802.3 standards (Ethernet, Gigabit Ethernet) or the like. Communication interfaces 606 may comprise a combination of wireless networking modules and wired networking modules to allow for transfer of data from circuit-carrying assembly 10 or for control of circuit-carrying assembly 10 by other devices. External bus 612 provides connections to allow the transfer of data from circuit-carrying assembly 10 (e.g. from non-volatile memory 604 and/or volatile memory 602) to external devices. External bus 612 may comprise connections that comply with standards such as USB (Universal Serial Bus), IEEE 1394 interface (FireWire), eSATA, or the like. Conditioning circuits 608 comprise signal conditioners for conditioning image data from image sensor 616, and such conditioners may include noise suppression chips, signal amplification chips or the like. Circuit-carrying assembly 10 may also comprise micro display 618 and micro display driver 620. Micro display 618 is configured to display the images captured by image sensor 616, and micro display driver 620 communicates with processor 600 to receive the imaging data and to display the imaging data on micro display 618.

As will be apparent to those skilled in the art in the light of the foregoing disclosure, many alterations and modifications are possible in the practice of this invention without departing from the spirit or scope thereof.

INTERPRETATION OF TERMS

Unless the context clearly requires otherwise, throughout the description and the "comprise", "comprising", and the like are to be construed in an inclusive sense, as opposed to an exclusive or exhaustive sense; that is to say, in the sense of "including, but not limited to";

"connected", "coupled", or any variant thereof, means any connection or coupling, either direct or indirect, between two or more elements; the coupling or connection between the elements can be physical, logical, or a combination thereof;

"herein", "above", "below", and words of similar import, when used to describe this specification, shall refer to this specification as a whole, and not to any particular portions of this specification;

"or", in reference to a list of two or more items, covers all of the following interpretations of the word: any of the items in the list, all of the items in the list, and any combination of the items in the list;

the singular forms "a", "an", and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. An imaging system comprising:
    a rigid support member;
    a circuit board assembly comprising a circuit board, the circuit board comprising a flat sheet of circuit board material formed to provide:
        a first part carrying a first image sensor;
        a second part spaced apart from the first part and carrying an optical device; and
        a compliant part between the first and the second parts, the compliant part allowing the second part to move toward and away from the first part;
        the first, second, and compliant parts of the circuit board being coplanar with one another in a common plane;
    a first attachment fixedly attaching the first part to the rigid support member; and
    a second attachment spaced apart from the first attachment along the rigid support member, the second attachment fixedly attaching the second part to the rigid support member.

2. An imaging system according to claim 1 wherein the optical device comprises a second image sensor or a structured light source.

3. An imaging system according to claim 1 wherein the compliant part comprises one or more compliant bridges formed in the circuit board, the bridges lying in the common plane and having portions extending in a direction that is transverse to an axis extending between the first and second parts, the bridges connecting a section of the circuit board containing the first part to a section of the circuit board containing the second part, and the bridges being flexibly deformable while remaining in the common plane to allow the second part to move toward and away from the first part.

4. An imaging system according to claim 1 wherein the compliant part comprises a part wherein the circuit board is cut away to provide thin strips of the circuit board, the thin strips connecting the first and second parts.

5. An imaging system according to claim 4 wherein one or more of the thin strips has a ratio of length-to-width in the range of 4 to 20.

6. An imaging system according to claim 4 wherein the thin strips have parts extending transversely to an axis extending between the first and second parts.

7. An imaging system according to claim 4 wherein the thin strips extend across the compliant part and are sinuous in the common plane.

8. An imaging system according to claim 6 wherein the compliant part is symmetrical about the axis.

9. An imaging system according to claim 4 comprising electrically conductive traces extending along the thin strips.

10. An imaging system according to claim 1 wherein the compliant part comprises a first compliant part between the first part and a central part of the circuit board assembly and a second compliant part between the second part and the central part of the circuit board assembly.

11. An imaging system according to claim 1 wherein the first and second attachments each comprises a plurality of fasteners attaching the circuit board assembly to the rigid support member.

12. An imaging system according to claim 1 wherein the rigid support member has first and second apertures respectively located adjacent to the first and second parts and the imaging system comprises a lens supported in the first aperture.

13. An imaging system according to claim 1 wherein the compliant part comprises at least one aperture arranged to define an edge of at least one bridge member.

14. An imaging system according to claim 13 wherein each of the first and second parts comprises a circuit-carrying island having an edge portion defined by the at least one aperture.

15. An imaging system according to claim 1 wherein the circuit board assembly is L-shaped.

16. An imaging system according to claim 1 comprising at least one thermally conductive path thermally connecting the circuit board assembly to the rigid support member.

17. An imaging system according to claim 16 wherein the at least one thermally conducting path is provided at or near a midpoint between the first part and the second part.

18. An imaging system according to claim 16 wherein the at least one thermally conductive path is provided at or near one or more heat generating components mounted on the circuit board assembly.

19. An imaging system according to claim 16 wherein the at least one thermally conductive path is provided by a thermal paste or a resilient pad.

20. A circuit-carrying assembly for use in an imaging system, the assembly comprising:
 a first circuit carrier;
 a second circuit carrier spaced apart from the first circuit carrier;
 at least one attachment member to attach the first circuit carrier of the circuit-carrying assembly to a rigid support member;
 at least one attachment member to attach the second circuit carrier of the circuit-carrying assembly to the rigid support member; and
 a compliant part between the first circuit carrier and the second circuit carrier, the compliant part allowing the second circuit carrier to move toward and away from the first circuit carrier wherein the first circuit carrier, the second circuit carrier, and the compliant part are coplanar in a common plane and each is a part of a flat, unitary circuit-carrying substrate and the compliant part is provided by a two-dimensional shaping of the circuit board material in the common plane.

21. A circuit-carrying assembly according to claim 20 wherein the circuit-carrying substrate is planar and the compliant part comprises a strip of the circuit-carrying substrate that is resiliently flexible in the common plane of the circuit-carrying substrate.

22. A circuit-carrying assembly according to claim 21 wherein the first circuit carrier and the second circuit carrier are located at opposed edges of the unitary circuit-carrying substrate.

23. A circuit-carrying assembly according to claim 20 wherein the compliant part comprises at least one aperture in the circuit-carrying assembly and at least one bridge member.

24. A circuit-carrying assembly according to claim 23 wherein the at least one bridge member has a ratio of length-to-width in the range of 4 to 20.

25. A circuit-carrying assembly according to claim 23 wherein the at least one bridge member extends across the compliant part and is sinuous in the common plane.

26. A circuit-carrying assembly according to claim 23 wherein the at least one bridge member extends transversely to an axis extending between the first circuit carrier and the second circuit carrier.

27. A circuit-carrying assembly according to claim 26 wherein the compliant part is symmetrical about the axis.

28. A circuit-carrying assembly according to claim 20 wherein the compliant part comprises at least one cut-out extending from an edge of the circuit-carrying assembly.

29. A circuit-carrying assembly according to claim 20 wherein each of the first circuit carrier and the second circuit carrier comprises a circuit-carrying island.

30. A circuit-carrying assembly according to claim 20 further comprising a third circuit carrier.

31. A circuit-carrying assembly according to claim 20 attached to a rigid support member and comprising one or more thermally conductive elements arranged to provide a thermally conductive path between the circuit-carrying assembly and the rigid support member.

32. A circuit-carrying assembly according to claim 31 wherein the thermally conductive path comprises a thermal paste.

33. An imaging system comprising the circuit-carrying assembly of any one of claims 20 to 32 and an imaging chip mounted to at least one of the first and second circuit carriers.

34. A circuit board for an imaging system, the circuit board comprising:

a circuit board substrate comprising a flat sheet of circuit board material formed to provide: a first circuit carrier, a second circuit carrier and at least one compliant portion located between the first and second circuit carrier, wherein the first and second circuit carriers and the compliant portion are each integral to the same unitary sheet of circuit board material and are coplanar with one another in a common plane, the compliant portion comprising a two-dimensional shaping of the circuit board material in the common plane, the compliant portion being deformable in the common plane to accommodate motion of the second circuit carrier toward and away from the first circuit carrier;

a first image sensor mounted on the first circuit carrier;

an electro optical component comprising a second image sensor or a structured light source mounted on the second circuit carrier;

a data communication interface on the circuit board substrate electrically connected to receive data from the first image sensor by way of conducting traces extending through the at least one compliant portion.

35. A circuit board for an imaging system according to claim 34 wherein the data communication interface is electrically connected to receive data from the second image sensor by way of the conducting traces.

36. A circuit board for an imaging system according to claim 33 wherein the first circuit carrier, the second circuit carrier, and the at least one compliant portion are provided by cuts in the circuit board substrate.

* * * * *